(12) United States Patent
Lin

(10) Patent No.: US 9,169,857 B2
(45) Date of Patent: Oct. 27, 2015

(54) FASTENING STRUCTURE FOR THERMAL MODULE

(71) Applicant: Asia Vital Components Co., Ltd., New Taipei (TW)

(72) Inventor: Sheng-Huang Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 14/278,107

(22) Filed: May 15, 2014

(65) Prior Publication Data

US 2014/0248078 A1  Sep. 4, 2014

Related U.S. Application Data

(62) Division of application No. 13/364,327, filed on Feb. 2, 2012.

(51) Int. Cl.
| | |
|---|---|
| *H01L 23/427* | (2006.01) |
| *F16B 2/06* | (2006.01) |
| *F16B 21/07* | (2006.01) |
| *F16B 21/08* | (2006.01) |
| *F16B 43/02* | (2006.01) |
| *H01L 23/40* | (2006.01) |
| *F16B 5/02* | (2006.01) |

(52) U.S. Cl.
CPC ............... *F16B 2/065* (2013.01); *F16B 21/078* (2013.01); *F16B 21/088* (2013.01); *F16B 43/025* (2013.01); *H01L 23/427* (2013.01); *F16B 5/0241* (2013.01); *F28F 2275/20* (2013.01); *H01L 2023/4087* (2013.01); *H01L 2924/0002* (2013.01); *Y10T 403/54* (2015.01); *Y10T 403/7033* (2015.01)

(58) Field of Classification Search
CPC .............. H01L 23/427; H01L 23/4093; H01L 23/4006
USPC .......... 403/329, 326, 373, 376, 381; 361/709, 361/710, 679.54, 679.58
See application file for complete search history.

(56) References Cited

U.S. PATENT DOCUMENTS

| | | | | | |
|---|---|---|---|---|---|
| 5,617,292 | A | * | 4/1997 | Steiner | 361/706 |
| 5,621,244 | A | * | 4/1997 | Lin | 257/713 |
| 5,870,288 | A | * | 2/1999 | Chen | 361/704 |
| 5,886,871 | A | * | 3/1999 | Jeffries et al. | 361/704 |
| 5,889,653 | A | * | 3/1999 | Clemens et al. | 361/704 |
| 5,917,701 | A | * | 6/1999 | Solberg | 361/704 |
| 6,130,821 | A | * | 10/2000 | Gerber | 361/704 |
| 6,141,220 | A | * | 10/2000 | Lin | 361/704 |
| 6,161,611 | A | * | 12/2000 | Cheng | 165/80.3 |
| 6,243,266 | B1 | * | 6/2001 | Lo | 361/704 |

(Continued)

*Primary Examiner* — Daniel Wiley
(74) *Attorney, Agent, or Firm* — C. G. Mersereau; Nikolai & Mersereau, P.A.

(57) ABSTRACT

A fastening structure is provided for fastening a thermal module to a mainboard, and includes a main body having at least one elastic press portion, a fastening portion, and an insertion unit. The fastening portion is provided on an end of the main body and the insertion unit is outward extended from another opposite end of the main body. The elastic press portion is provided on the main body and located between the insertion unit and the fastening portion, and a flexible space is defined between the elastic press portion and the main body. With these arrangements, the fastening structure can be quickly assembled to the thermal module without the need of welding and can therefore be conveniently separated therefrom whenever reworking is necessary.

5 Claims, 26 Drawing Sheets

(56) References Cited

U.S. PATENT DOCUMENTS

| | | | | |
|---|---|---|---|---|
| 6,246,584 B1 * | 6/2001 | Lee et al. | | 361/704 |
| 6,470,962 B1 * | 10/2002 | Pao | | 165/80.3 |
| 6,477,050 B1 * | 11/2002 | Herring et al. | | 361/704 |
| 6,507,981 B1 * | 1/2003 | Bosak, III et al. | | 24/457 |
| 6,621,704 B1 * | 9/2003 | Liu | | 361/704 |
| 6,639,800 B1 * | 10/2003 | Eyman et al. | | 361/704 |
| 6,640,882 B2 * | 11/2003 | Dowdy et al. | | 165/80.3 |
| 6,646,881 B1 * | 11/2003 | Lai et al. | | 361/719 |
| 6,704,976 B1 * | 3/2004 | Chen | | 24/459 |
| 6,816,375 B2 * | 11/2004 | Kalyandurg | | 361/704 |
| 6,968,889 B2 * | 11/2005 | Wang et al. | | 165/80.1 |
| 7,009,843 B2 * | 3/2006 | Lee et al. | | 361/704 |
| 7,055,589 B2 * | 6/2006 | Lee et al. | | 165/185 |
| 7,239,518 B2 * | 7/2007 | Yang et al. | | 361/704 |
| 7,310,229 B2 * | 12/2007 | Lee et al. | | 361/697 |
| 7,321,492 B2 * | 1/2008 | Wang et al. | | 361/709 |
| 7,344,345 B2 * | 3/2008 | Aukzemas | | 411/372 |
| 7,345,880 B2 * | 3/2008 | Lo | | 361/704 |
| 7,388,747 B2 * | 6/2008 | Yang et al. | | 361/700 |
| 7,436,671 B2 * | 10/2008 | Chen et al. | | 361/710 |
| 7,460,372 B2 * | 12/2008 | Liao et al. | | 361/704 |
| 7,493,940 B2 * | 2/2009 | Chen et al. | | 165/121 |
| 7,616,441 B2 * | 11/2009 | Horng | | 361/697 |
| 7,782,623 B2 * | 8/2010 | Liu | | 361/719 |
| 7,990,722 B2 * | 8/2011 | Cao et al. | | 361/721 |
| 8,063,485 B1 * | 11/2011 | Azar | | 257/727 |
| 2004/0257786 A1 * | 12/2004 | Murasawa | | 361/810 |
| 2005/0111196 A1 * | 5/2005 | Wang et al. | | 361/719 |
| 2005/0152119 A1 * | 7/2005 | Lee et al. | | 361/710 |
| 2005/0195573 A1 * | 9/2005 | Huang | | 361/709 |
| 2008/0218976 A1 * | 9/2008 | Chen et al. | | 361/710 |
| 2010/0053906 A1 * | 3/2010 | Liu | | 361/720 |
| 2011/0075370 A1 * | 3/2011 | Abe et al. | | 361/700 |
| 2011/0108234 A1 * | 5/2011 | Cao et al. | | 165/67 |

* cited by examiner

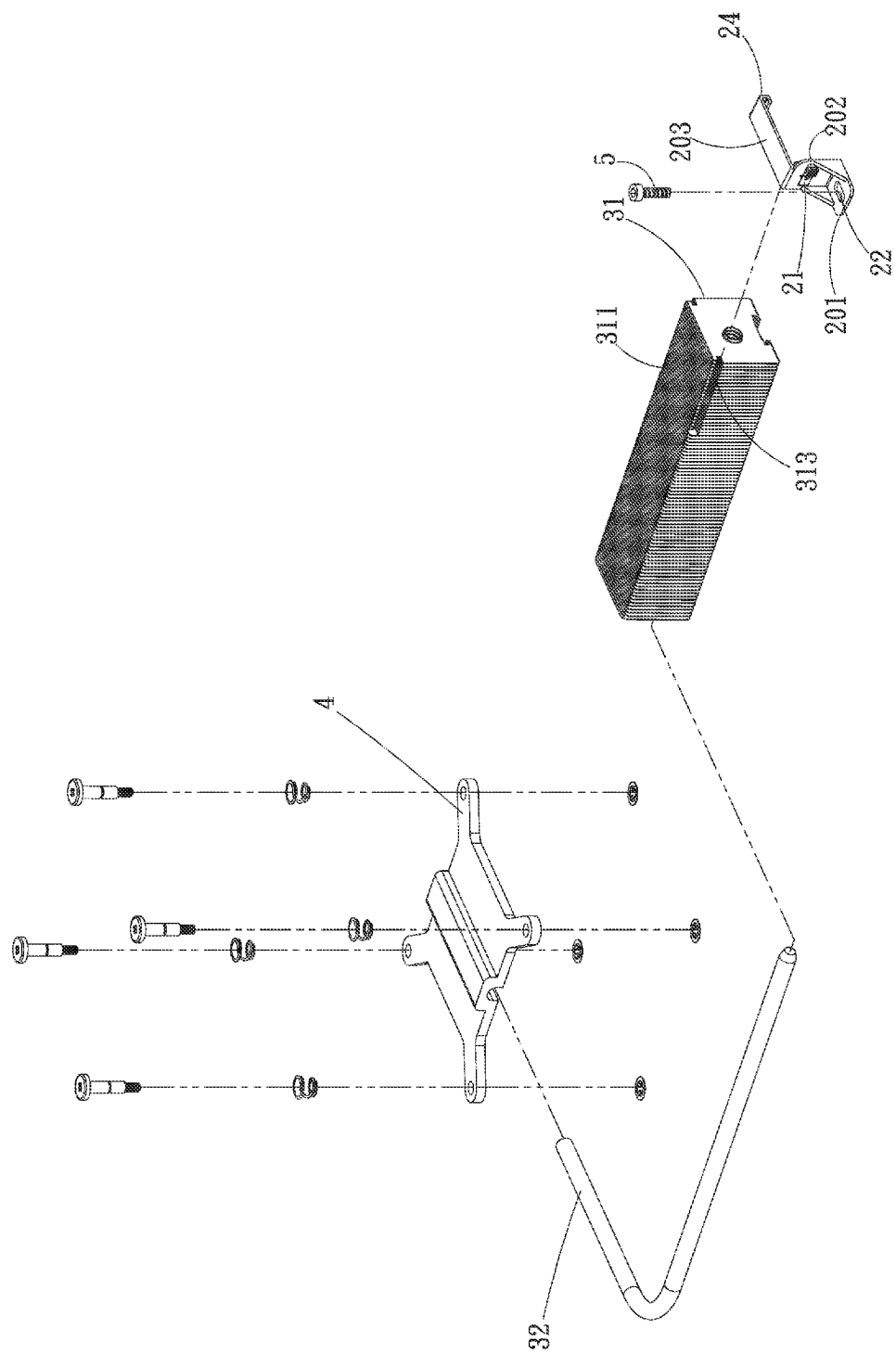

FASTENING STRUCTURE FOR THERMAL MODULE

CROSS-REFERENCE TO RELATED APPLICATIONS

The present application is a division of U.S. patent application Ser. No. 13/364,327, filed on Feb. 2, 2012, titled Fastening Structure for Thermal Module, listing Sheng-Huang Lin as inventor.

FIELD OF THE INVENTION

The present invention relates to a fastening structure for thermal module, and more particularly to a fastening structure that can be quickly assembled to a thermal module for fastening the latter to a mainboard and can also be conveniently separated from the thermal module whenever reworking is necessary.

BACKGROUND OF THE INVENTION

Thanks to the progress in various technological fields, 3C products (Communication, Consumer electronics, and Computer products) have been constantly improved. For instance, the currently available computer systems now have quicker and quicker computing speed, and the central processing unit (CPU) or the microprocessor of a computer system performing the major computing function thereof has more powerful processing capability. However, the size of the CPU or microprocessor for the computer system does not increase along with the enhanced ability thereof, but is even reduced in some cases. That is, the density of the integrated circuits provided on the CPU or the microprocessor is obviously increased. Thus, heat produced by the CPU or the microprocessor during operation thereof also largely increases to adversely raise the surface temperature of the CPU or the microprocessor even to a level higher than 100° C.

To prevent the CPU or the microprocessor from being damaged or causing burnout of nearby elements due to the high temperature thereof, it is necessary to have some mechanism for timely removing the produced heat from the CPU or the microprocessor. Generally, such heat removing mechanism includes a thermal module having a base attached to a surface of a heat-producing element, such as the CPU, the microprocessor, a graphics chip, or a south and a north bridge chip, for absorbing the produced heat; and a heat pipe transferring the heat from the base to a plurality of radiating fins, which is extended through by the heat pipe, so that the produced heat is finally radiated from the radiating fins into ambient air. For the thermal module to stably mount to a mainboard of the computer system, a fastening device is usually needed to connect to the radiating fins extended through by the heat pipe, and a fastening element, such as a screw, is then downward extended through the fastening device to screw into the mainboard.

FIGS. 1A and 1B as well as FIGS. 1C and 1D showing a first and a second conventional manner, respectively, for fastening a thermal module to a mainboard. The thermal module includes a base 10, a heat pipe 11, a plurality of radiating fins 12, and a fastening device. The heat pipe 11 has an end attached to one side of the base 10, and another side of the base 10 is in contact with a heat-producing element, such as a CPU, a microprocessor, a graphics chip, a south bridge chip or a north bridge chip (not shown). Another end of the heat pipe 11 is extended through the radiating fins 12. The radiating fins 12 has a recess 121 formed on one side facing toward the fastening device 13 for receiving the fastening device 13 therein.

The fastening device 13 is made of a metal material, such as iron or copper, and has an end welded to a predetermined position on the radiating fins 12, so that a weld layer 15 is formed between one end of the fastening device 13 and the radiating fins 12 to permanently connect the fastening device 13 to the radiating fins 12. Another opposite end of the fastening device 13 is provided with a fastening hole 131, via which a fastening element 17 is downward extended to screw into a mainboard (not shown), so that the radiating fins 12 are firmly attached to the mainboard via the fastening device 13.

While the fastening device 13 enables fixed connection of the radiating fins 12 to the mainboard, the radiating fins 12 and the fastening device 13 welded thereto could not be separated from one another for reworking unless the weld layer 15 is completely removed from between the radiating fins 12 and the fastening device 13. However, when trying to remove the weld layer 15, it is almost inevitable to cause damages to the fastening device 13 and/or the radiating fins 12.

Further, when using the fastening device 13 to fasten the radiating fins 12 to the mainboard, the fastening device 13 is fixedly connected to the radiating fins 12 via the weld layer 15 and could not be freely adjusted to different positions to adapt to different designs. As a result, the conventional fastening device 13 has low applicability and is inconvenient for use and must be produced in different dimensions to match different design requirements, which inevitably increases the overall cost for mounting the thermal module to the mainboard.

In brief, the conventional fastening device for thermal module has the following disadvantages: (1) not allowing easy reworking; (2) increasing the cost for mounting the thermal module; and (3) not convenient for use.

It is therefore tried by the inventor to develop an improved fastening structure for thermal module, so as to eliminate the above drawbacks.

SUMMARY OF THE INVENTION

A primary object of the present invention is to provide a fastening structure that can be quickly assembled to a thermal module for fastening the same to a mainboard and can also be conveniently separated from the thermal module whenever reworking is necessary.

Another object of the present invention is to provide a fastening structure for thermal module that provides high convenience and flexibility in use and reduces the cost needed for assembling it to the thermal module.

To achieve the above and other objects, the fastening structure for thermal module according to an embodiment of the present invention includes a main body having at least one elastic press portion, a fastening portion, and an insertion unit. The fastening portion is provided on an end of the main body, and the insertion unit is outward extended from another opposite end of the main body. The elastic press portion is provided on the main body and located between the insertion unit and the fastening portion, and a flexible space is defined between the elastic press portion and the main body. With the above arrangements, the fastening structure can be stably and firmly assembled to the thermal module for fastening the latter to a mainboard or be quickly separated from the thermal module for easy reworking, and therefore provides high convenience and flexibility in use and save the cost for welding it to the thermal module.

To achieve the above and other objects, the fastening structure for thermal module according to another embodiment of the present invention includes a main body having at least one elastic press portion, a fastening portion, and an insertion unit. The fastening portion is provided on an end of the main body, and the insertion unit is outward extended from another opposite end or from two opposite lateral sides of the main body. The elastic press portion is connected to the end of the main body having the fastening portion provided thereon, and a flexible space is defined between the elastic press portion and the main body. With the above arrangements, the fastening structure can be stably and firmly assembled to the thermal module for fastening the latter to a mainboard or be quickly separated from the thermal module for easy reworking, and therefore provides high convenience and flexibility in use and save the cost for welding it to the thermal module.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIGS. 11A and 11B are assembled and exploded perspective views, respectively, of a fastening structure for thermal module according to a tenth embodiment of the present invention;

DETAILED DESCRIPTION OF THE PREFERRED EMBODIMENTS

Figure 1A:
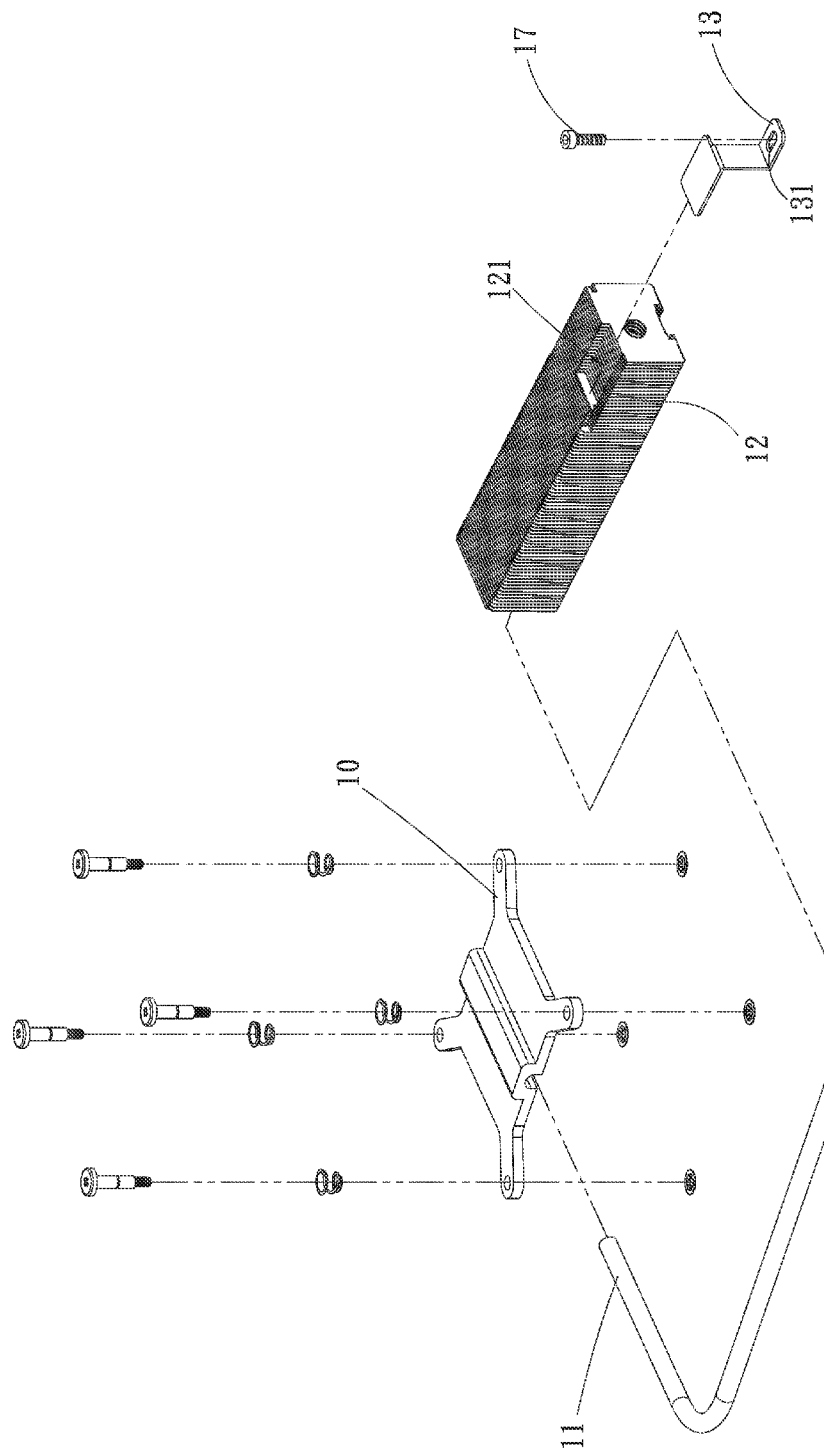
FIG. 1A is an exploded perspective view showing a first conventional manner for fastening a thermal module to a mainboard.
Figure 1B:
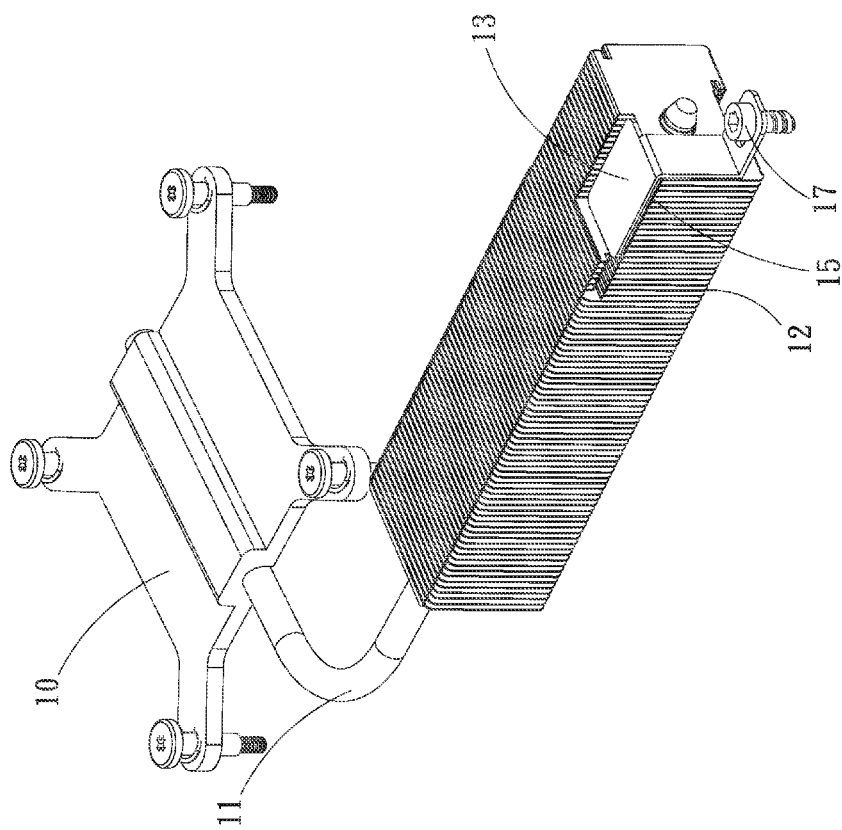
FIG. 1B is an assembled view of FIG. 1A.
Figure 1C:
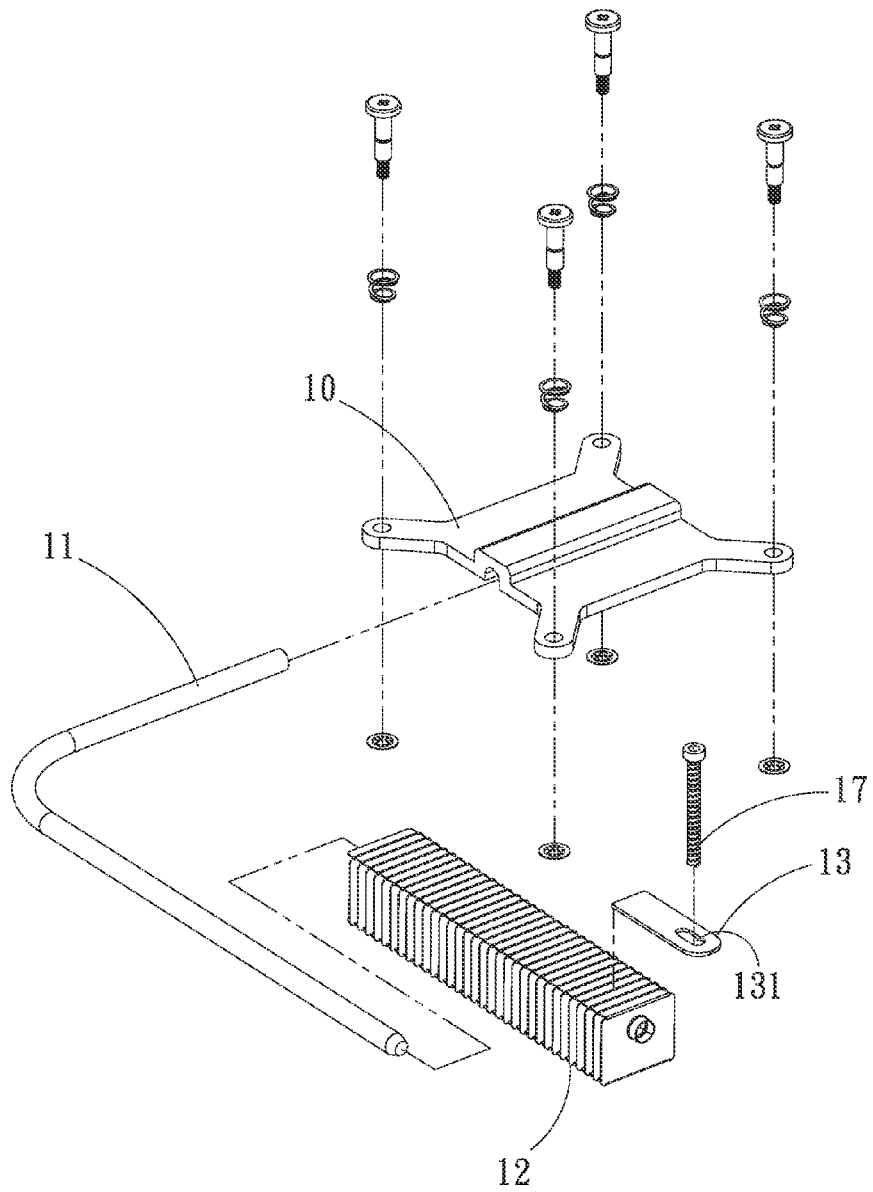
FIG. 1C is an exploded perspective view showing a second conventional manner for fastening a thermal module to a mainboard.
Figure 1D:
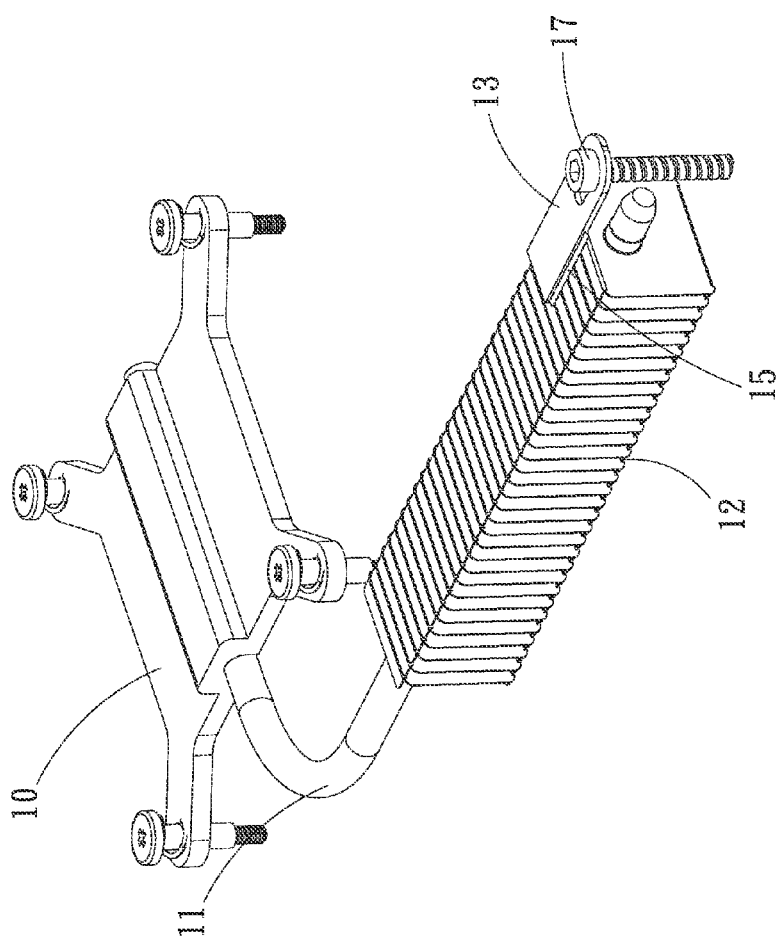
FIG. 1D is an assembled view of FIG. 1C.

The present invention will now be described with some preferred embodiments thereof and with reference to the accompanying drawings. For the purpose of easy to understand, elements that are the same in the preferred embodiments are denoted by the same reference numerals.

Figure 2:
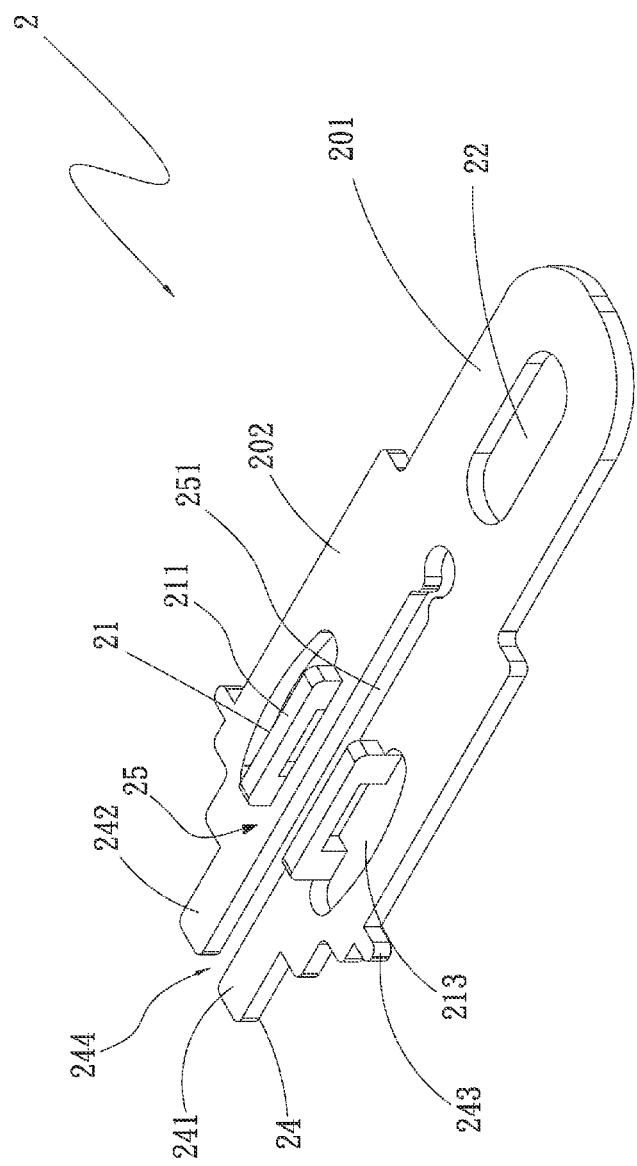
FIG. 2 is a perspective view of a fastening structure for thermal module according to a first embodiment of the present invention.

Please refer to FIG. 2 that is a perspective view of a fastening structure for thermal module according to a first embodiment of the present invention. As shown, in the first embodiment, the fastening structure includes a main body 2, which has at least one elastic press portion 21, a fastening portion 22, an insertion unit 24, a first body section 201, and a second body section 202 radially extended from an end of the first body section 201. The fastening portion 22 is located at an end of the main body 2. More specifically, the fastening portion 22 is a hole formed on the first body section 201 and penetrating the same in a thickness direction thereof for a fastening element 5, such as a screw shown in FIG. 3A, to downward extend therethrough and screw into a mainboard (not shown).

The insertion unit 24 is extended from another end of the main body 2 opposite to the end with the fastening portion 22, and includes at least one first insertion section 241 and at least one second insertion section 242, and at least one stop section 243. The first and the second insertion section 241, 242 are projected from the other end of the main body 2, that is, an end of the second body section 202 facing away from the first body section 201, and have a space 244 defined between them. The stop sections 243 are separately protruded from two opposite lateral sides of the second body section 202.

The elastic press portion 21 is formed on the main body 2 between the insertion unit 24 and the fastening portion 22. The elastic press portion 21 includes at least one elastic press arm 211 and at least one opening 213. In the illustrated first embodiment, the elastic press arms 211 are provided on one side of the second body section 202 to face each other. The openings 213 are respectively located between one elastic press arm 211 and one corresponding lateral side of the second body section 202 to penetrate the second body section 202 in a thickness direction thereof, so that a user may conveniently apply forces on the elastic press arms 211.

As shown in FIG. 2, a flexible space 25 is defined between the elastic press portion 21 and the main body 2, so that the facing elastic press arms 211 on the second body section 202 are movable in the flexible space 25. In the flexible space 25, an axial long slot 251 is further formed on the second body section 202 between the facing elastic press arms 211 to penetrate the second body section 202 in the thickness direction thereof. The long slot 251 provides an elastically deformable space for the first and second insertion sections 241, 242 when they are compressed toward each other, and the long slot 251 communicates with the flexible space 25 and the space 244.

When the first and second insertion sections 241, 242 or the elastic press arms 211 are subjected to two inward push forces to move toward a central area of the flexible space 25, the first and the second insertion section 241, 242 are caused to elastically deform and shift toward a central area of the space 244, bringing the second body section 202 to elastically deform and move toward a central area of the long slot 251 at the same time. On the other hand, when the applied inward push forces are removed, the first and the second insertion 241, 242 or the elastic press arms 211 would simultaneously spring back to an original state free of any pressure. With the above design, the fastening structure of the present invention can be stably and firmly connected to a thermal module, and can also be easily separated from the thermal module whenever reworking is necessary. Therefore, the fastening structure enables high convenience and flexibility in use as well as reduced cost.

Figure 3A:
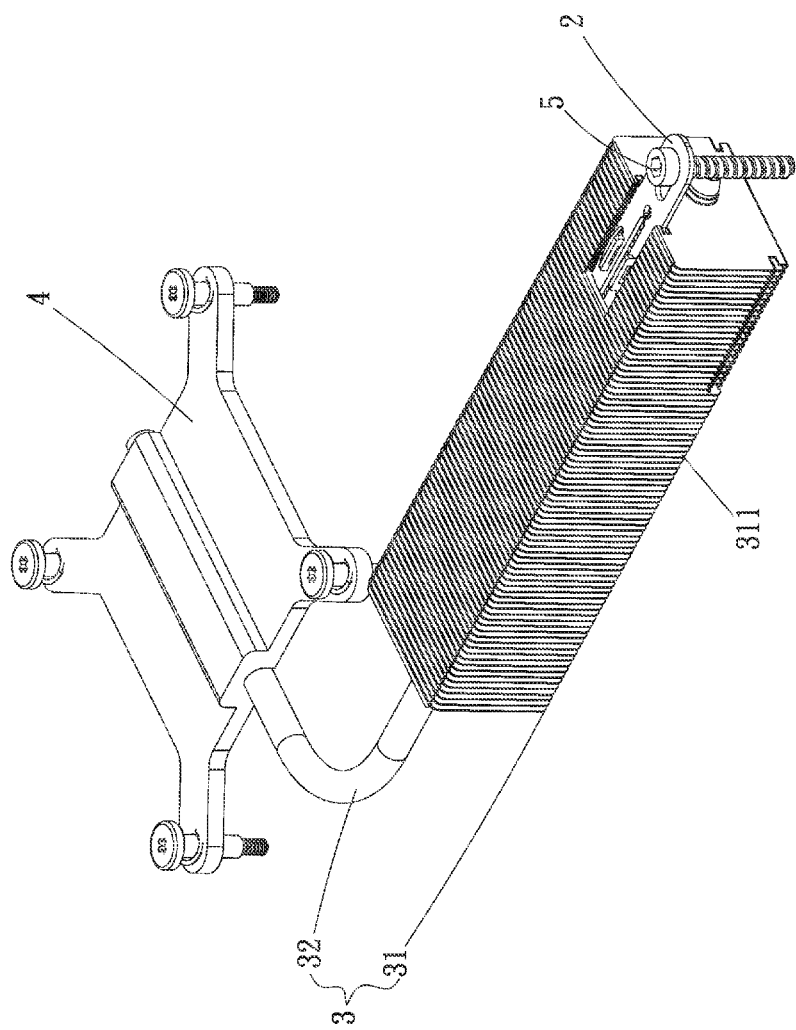
FIGS. 3A and 3B are assembled and exploded perspective views, respectively, of a fastening structure for thermal module according to a second embodiment of the present invention.
Figure 3B:
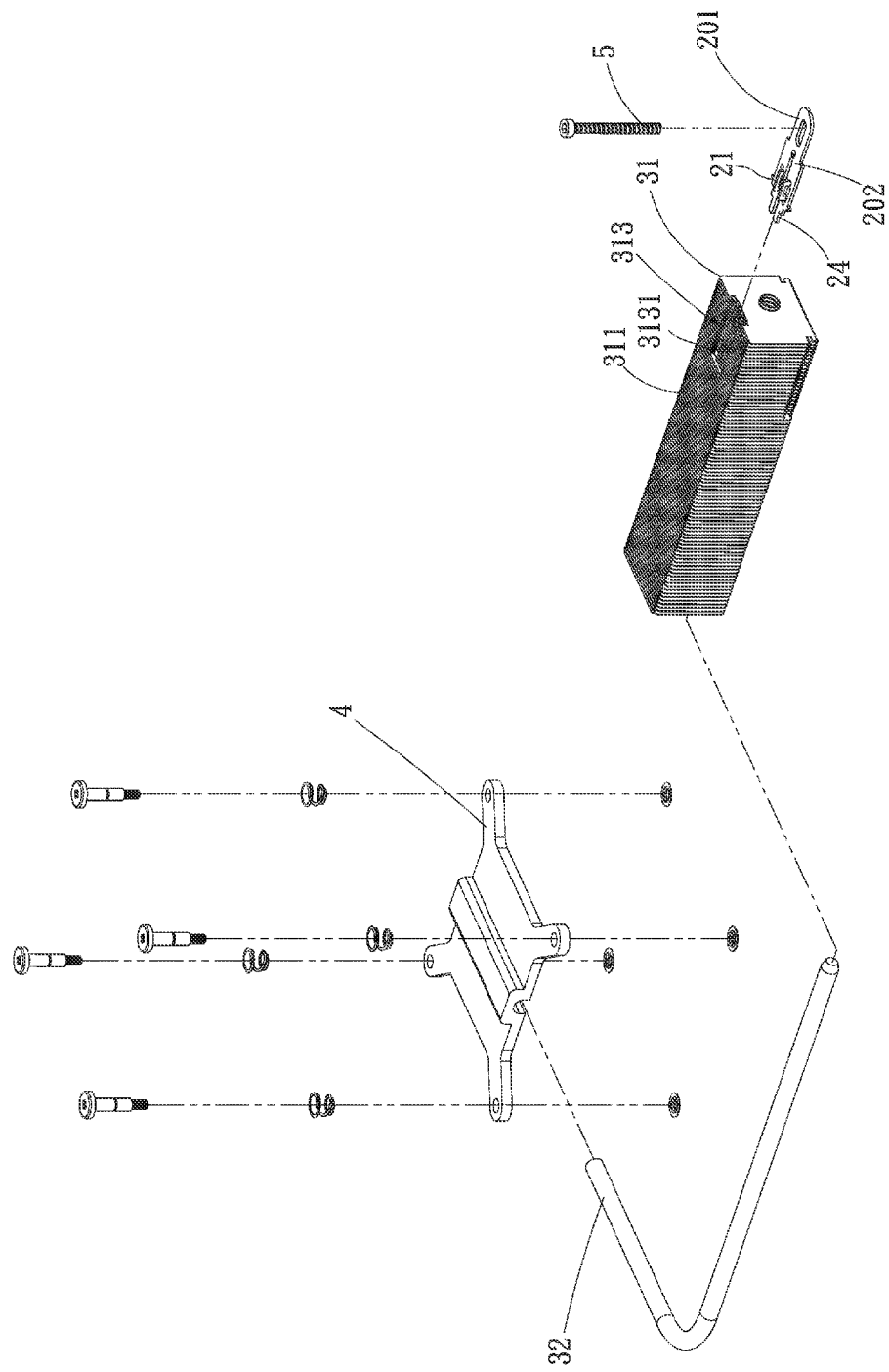

FIGS. 3A and 3B are assembled and exploded perspective views, respectively, of a fastening structure for thermal module according to a second embodiment of the present invention. Please refer to FIGS. 3A and 3B along with FIG. 2. The second embodiment is generally structurally similar to the first embodiment, except that, in the second embodiment, the main body 2 is assembled to a thermal module 3, which includes a heat radiating unit 31 and a heat transfer unit 32. The heat transfer unit 32 is in the form of a heat pipe having an end extended through a plurality of radiating fins 311 of the heat radiating unit 31 and another opposite end attached to one side of a base 4. The base 4 has another opposite side in contact with a heat-producing element (not shown), such as a CPU, a graphics chip, a south bridge chip, a north bridge chip or an executing unit, so as to absorb heat produced by the heat-producing element.

The heat radiating unit 31 can be a radiating fin assembly or a heat sink, and has a plurality of radiating fins 311. At least one recess 313 is formed on one side of the radiating fins 311 facing toward the main body 2 and the main body 2 is fixedly received in the recess 313. With the first and second insertion sections 241, 242 of the main body 2 inserted into an insertion hole 3131 in the recess 313 and the stop sections 243 sidewardly extended from the recess 313 into a passage (not shown) defined between two adjacent radiating fins 311, the main body 2 is quickly assembled to the heat radiating unit 31.

In the event it is necessary to rework, simply push the elastic press arms 211 toward the central area of the flexible space 25 at the same time, and the first and second insertion sections 241, 242 as well as the second body section 202 will elastically deform and move toward the central area of the space 244 and of the long slot 251, respectively. Meanwhile, the stop sections 243 will also move along with the second body section 202 to thereby separate from the passage defined between two adjacent radiating fins 311. At this point, the main body 2 can be quickly detached from the recess 313 on the radiating fins 311 without causing damage to the main body 2 and the heat radiating unit 31. Therefore, the fastening structure for thermal module according to the second embodiment of the present invention provides high convenience and flexibility in use and enables easy reworking when necessary.

Further, since the main body 2 of the fastening structure is connected to the heat radiating unit 31 without using any soldering material, cost for welding can be saved.

Figure 4A:
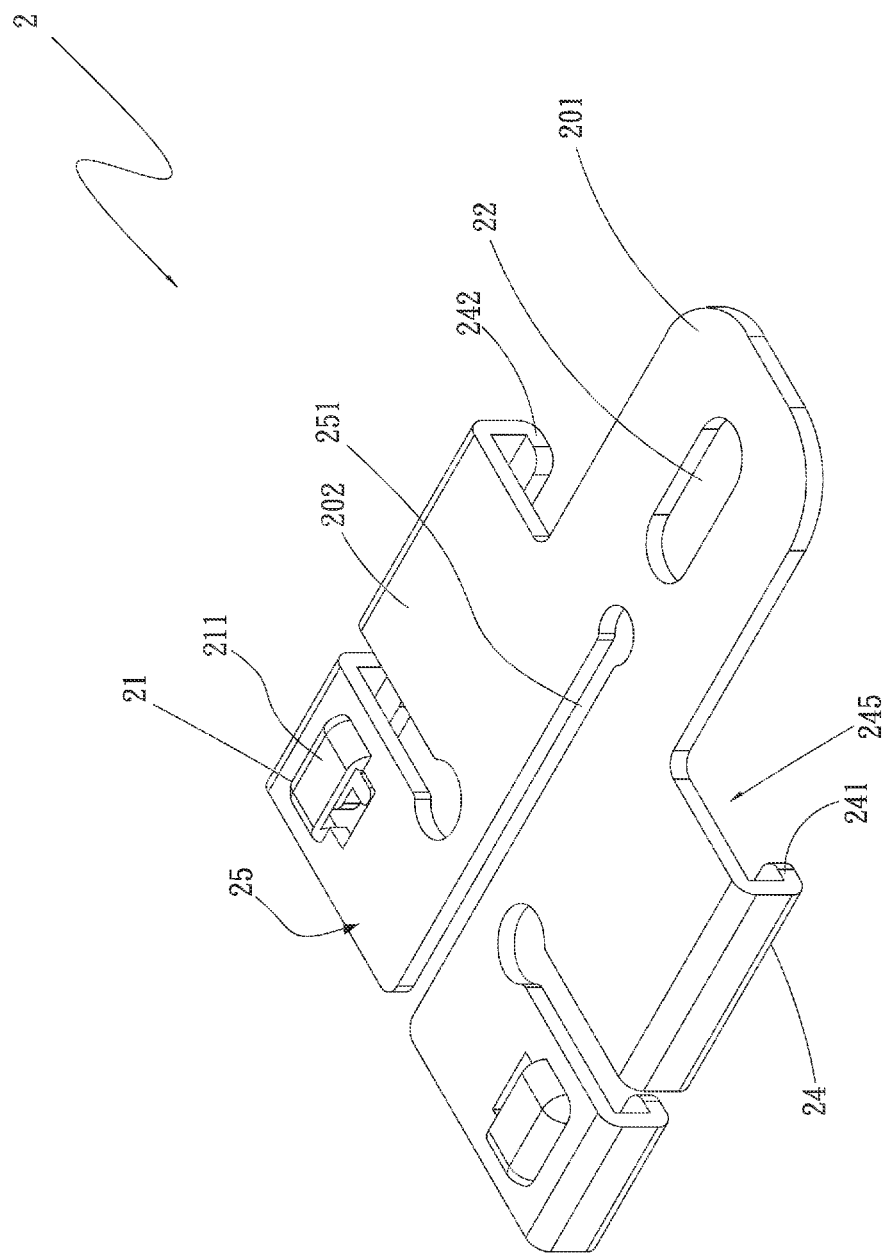
FIGS. 4A and 4B are top and bottom perspective views, respectively, of a fastening structure for thermal module according to a third embodiment of the present invention.
Figure 4B:
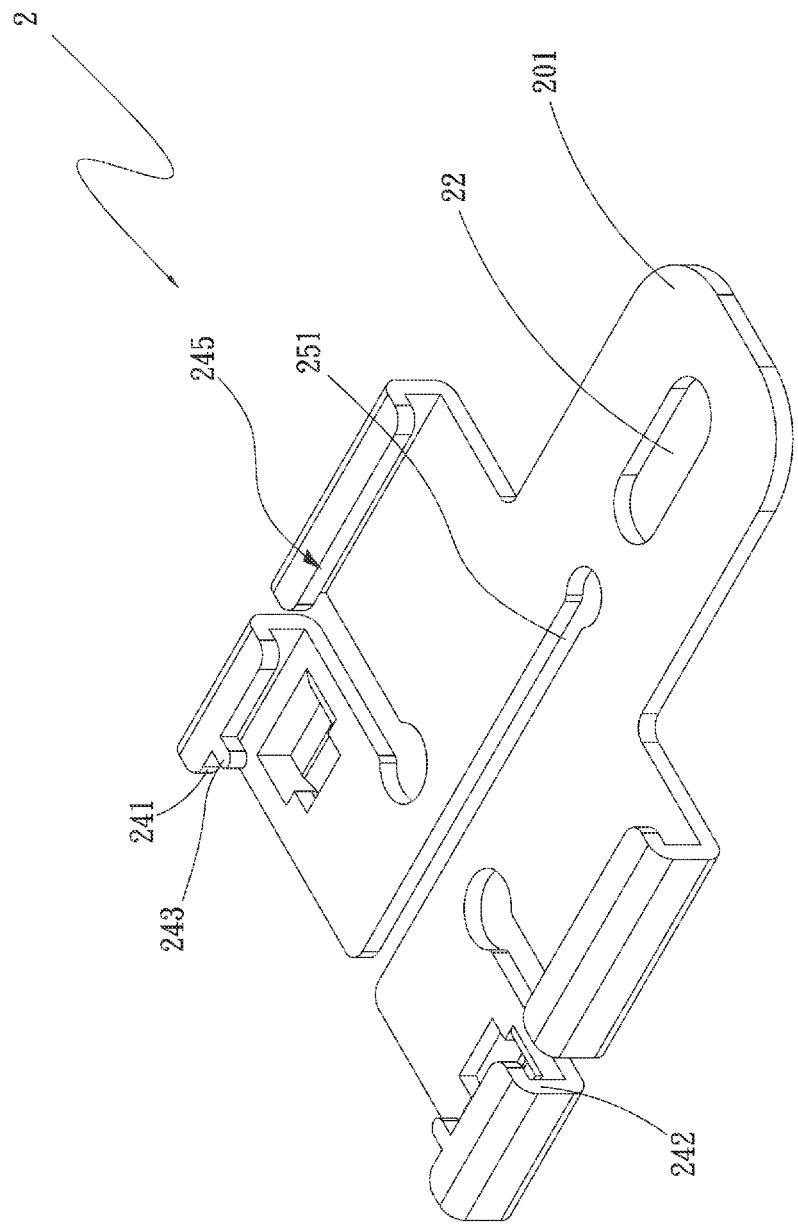

FIGS. 4A and 4B are top and bottom perspective views, respectively, of a fastening structure for thermal module according to a third embodiment of the present invention. As shown, the fastening structure according to the third embodiment is generally structurally similar to the first embodiment, except that, in the third embodiment, the first and the second insertion section 241, 242 of the insertion unit 24 are projected from two opposite lateral sides of the main body 2. That is, in the third embodiment, the first and the second insertion section 241, 242 of the insertion unit 24 are separately projected from two opposite lateral sides of the second body section 202, such that a receiving space 245 is defined below the main body 2 between the first and the second insertion section 241, 242 to communicate with the long slot 251.

Further, in the third embodiment, the stop sections 243 of the insertion unit 24 are located on the first and second insertion sections 241, 242. That is, as can be seen in FIG. 4B, the stop sections 243 are separately projected from the first and the second insertion section 241, 242 toward a central area of the receiving space 245.

When the facing elastic press arms 211 are subjected to two outward push forces to shift away from the flexible space 25, the first and the second insertion section 241, 242 are brought to elastically deform and shift away from the receiving space 245. Meanwhile, the second body section 202 will also elastically deform to move away from the long slot 251.

On the other hand, when the applied outward push forces are removed, the facing elastic press arms 211 and the first and second insertion sections 241, 242 would simultaneously spring back to a state free of any pressure. With the above design, the fastening structure of the present invention can provide high convenience and flexibility in use and enable easy reworking when necessary.

Figure 5A:
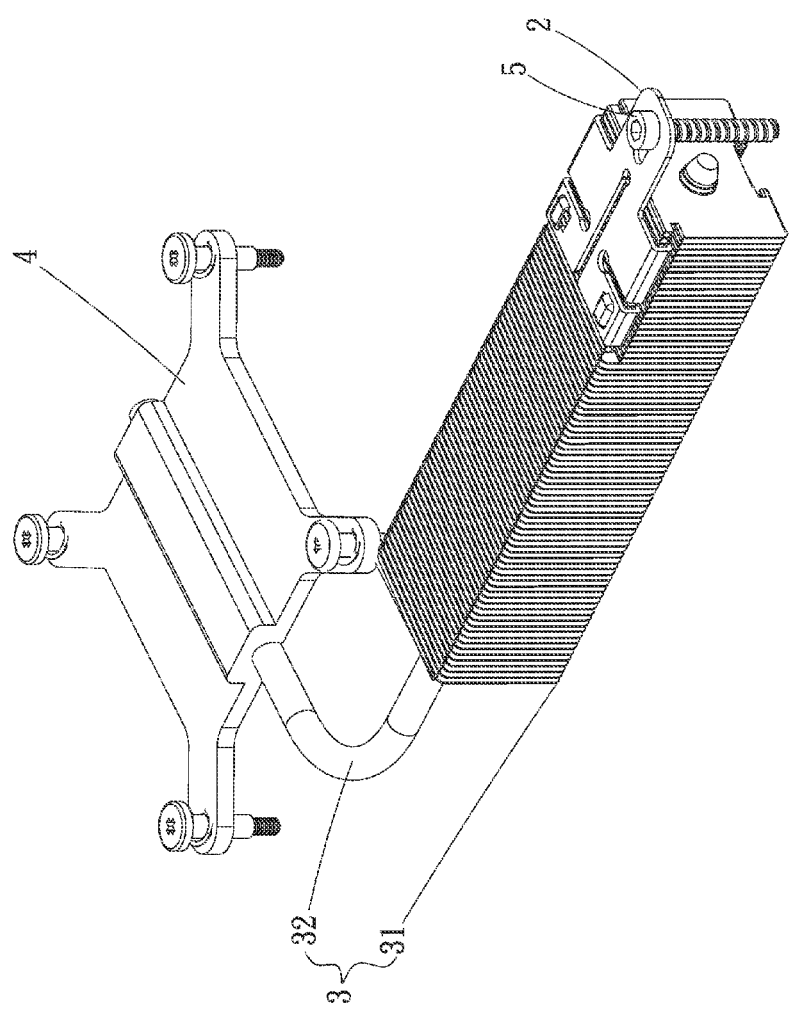
FIGS. 5A and 5B are assembled and exploded perspective views, respectively, of a fastening structure for thermal module according to a fourth embodiment of the present invention.
Figure 5B:
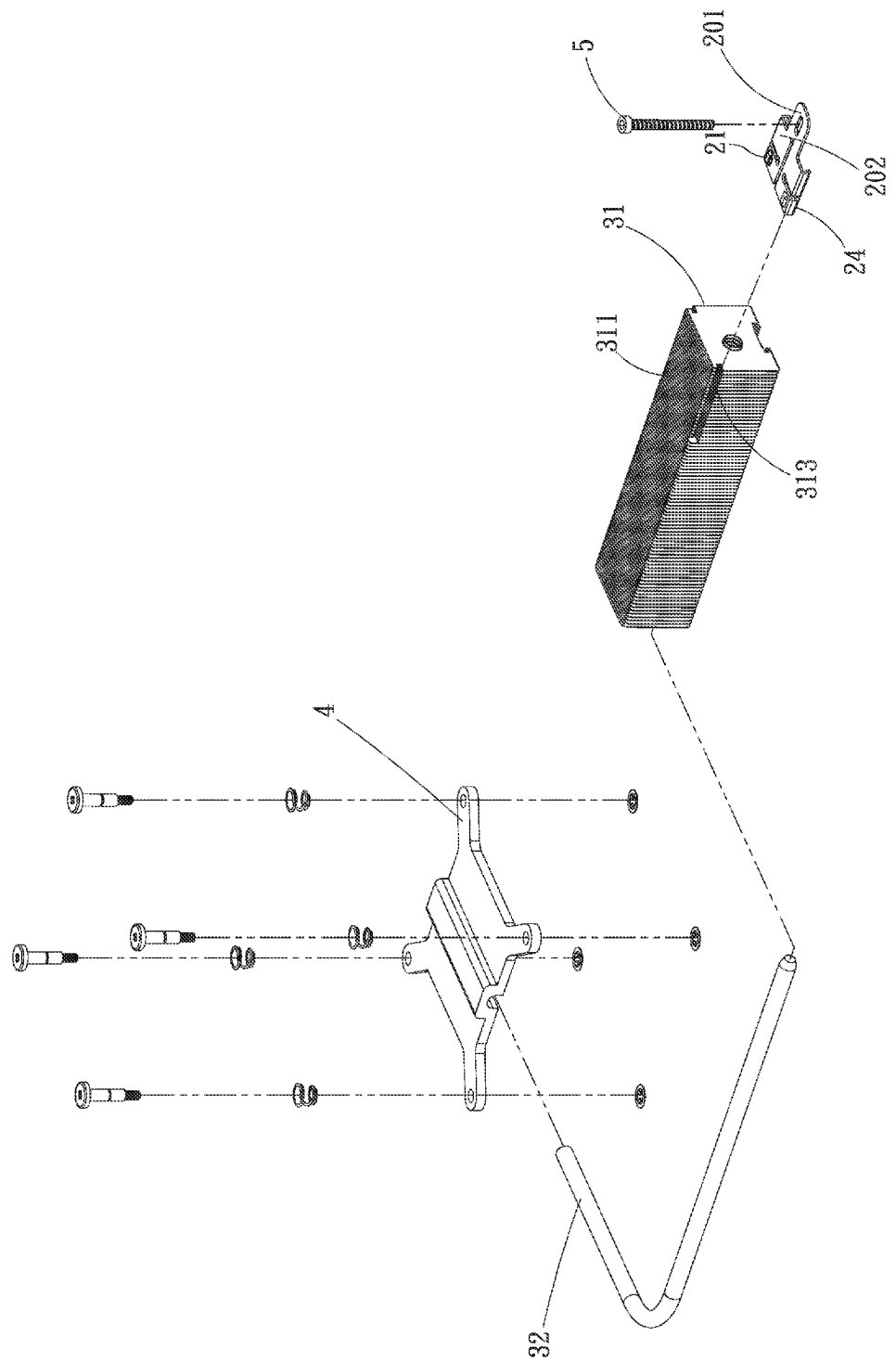

FIGS. 5A and 5B are assembled and exploded perspective views, respectively, of a fastening structure for thermal module according to a fourth embodiment of the present invention. Please refer to FIGS. 5A and 5B along with FIGS. 4A and 4B. The main body 2 in the fourth embodiment is generally structurally similar to the main body 2 in the third embodiment, except that, in the fourth embodiment, the main body 2 is assembled to a thermal module 3.

The thermal module 3 in the fourth embodiment is generally structurally similar to the thermal module 3 in the second embodiment, except that it has two recesses 313 separately formed on two opposite lateral sides of the radiating fins 311 for the first and the second insertion section 241, 242 to insert thereinto. With the first and the second insertion section 241, 242 inserted into the two recesses 313 and the two stop sections 243 inwardly extended into one passage (not shown) defined between two adjacent radiating fins 311, the main body 2 of the fastening structure can be quickly assembled to the heat radiating unit 31 of the thermal module 3.

In the event it is necessary to rework, simply push the elastic press arms 211 away from the flexible space 25, and the first and second insertion sections 241, 242 as well as the second body section 202 will elastically deform and move away from the receiving space 245 and the long slot 251, respectively. Meanwhile, the stop sections 243 will also move along with the first and second insertion sections 241, 242 to thereby separate from the passage between two adjacent radiating fins 311. At this point, the main body 2 can be quickly slid out of the recesses 313 to detach or separate from the radiating fins 311. Therefore, the fastening structure can be quickly separated from the thermal module without causing damage to the main body 2 and the radiating fins 311 to provide high convenience and flexibility in use and enable easy reworking when necessary.

Further, since the main body 2 is connected to the heat radiating unit 31 without using any soldering material, the cost for welding is saved.

Figure 6:
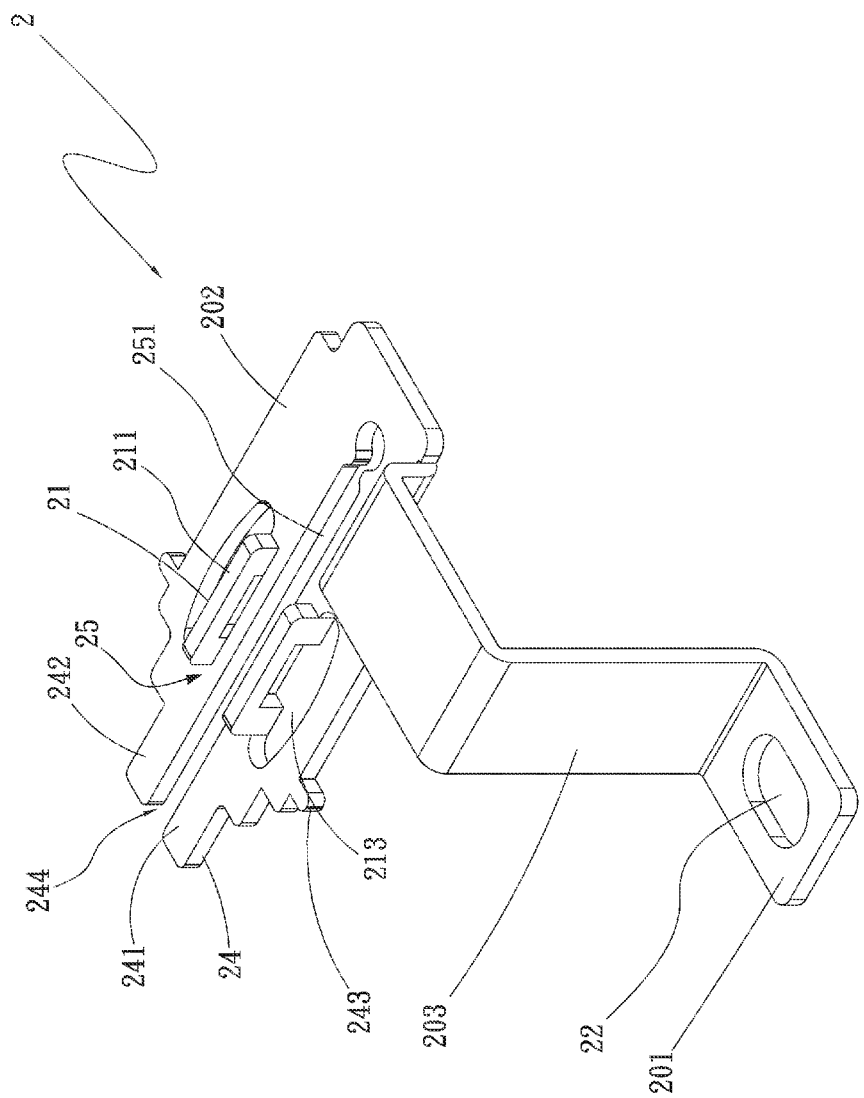
FIG. 6 is a perspective view of a fastening structure for thermal module according to a fifth embodiment of the present invention.

FIG. 6 is a perspective view of a fastening structure for thermal module according to a fifth embodiment of the present invention. As shown, the fastening structure according to the fifth embodiment is generally structurally similar to the first embodiment, except that, in the fifth embodiment, the main body 2 further includes a third body section 203 extended between and connected at two ends to the first and the second section 201, 202, such that the second body section 202 is located at a higher position relative to the first body section 201.

Figure 7A:
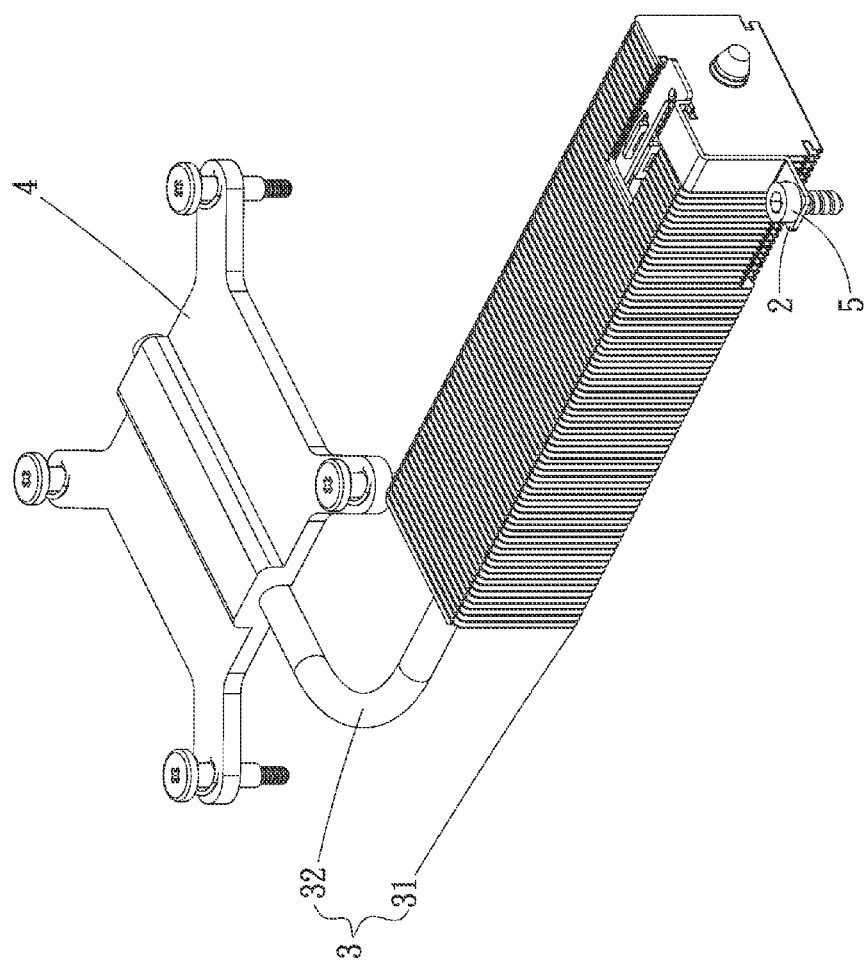
FIGS. 7A and 7B are assembled and exploded perspective views, respectively, of a fastening structure for thermal module according to a sixth embodiment of the present invention.

In practical implementation of the fifth embodiment, the third body section 203 may have an axially extended length and a width designed according to a height requirement of the thermal module 3 to which the main body 2 is to be assembled, as shown in FIG. 7A, so as to more firmly and stably fasten the thermal module 3 to the mainboard.

Figure 7B:
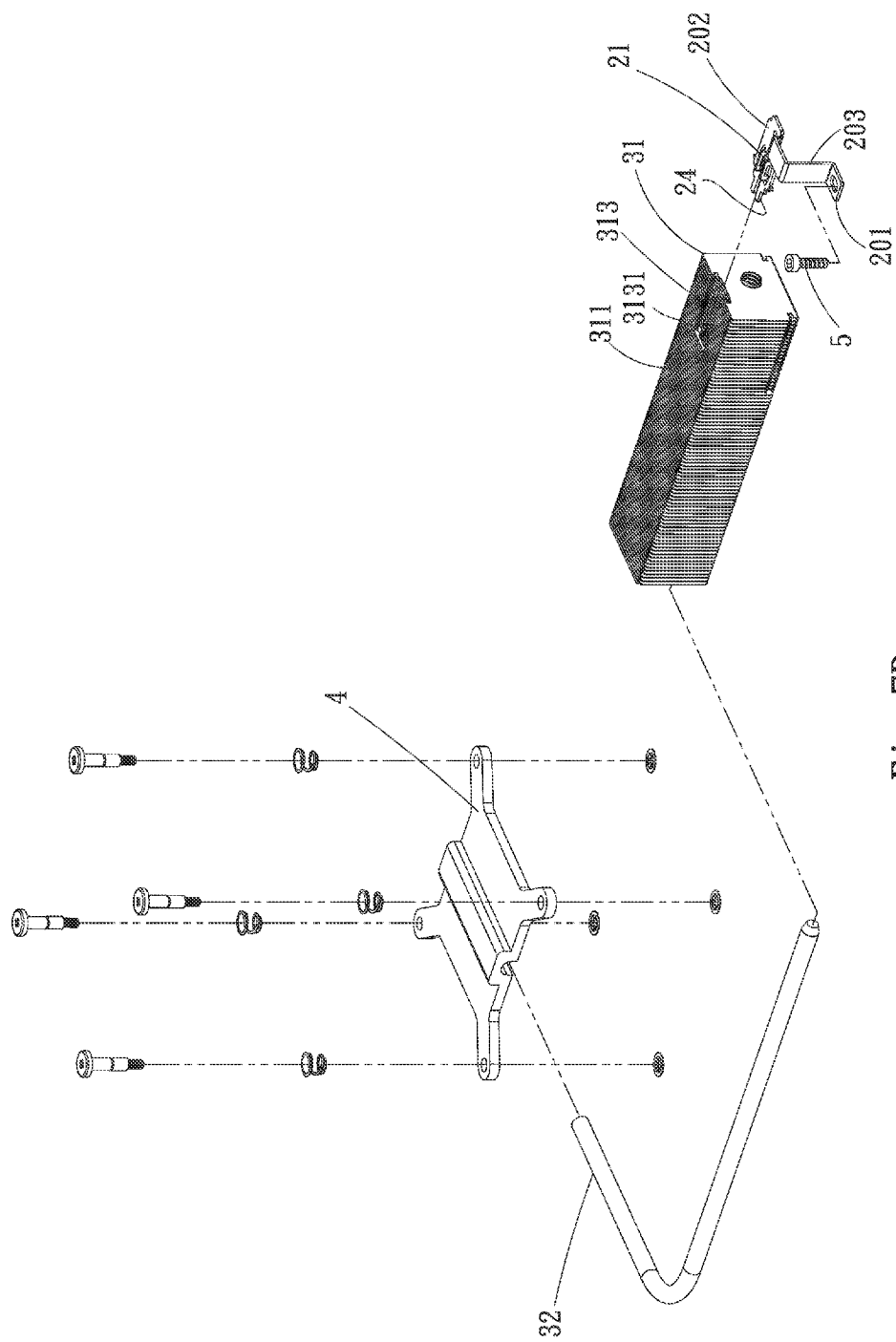

FIGS. 7A and 7B are assembled and exploded perspective views, respectively, of a fastening structure for thermal module according to a sixth embodiment of the present invention. Please refer to FIGS. 7A and 7B along with FIG. 6. The main body 2 in the sixth embodiment is generally structurally similar to the main body 2 in the fifth embodiment, except that it is assembled to a thermal module 3.

The thermal module 3 in the sixth embodiment is generally structurally similar to the thermal module 3 in the second embodiment, except that, in the sixth embodiment, the third body section 203 is tightly attached to a lateral side of the radiating fins 311, so that the radiating fins 311 is more stably fastened to the mainboard.

In the present invention, with the fastening structure and the thermal module 3 connected to each other to form an integral unit in the above manner, the main body 2 can be quickly detached from the thermal module 3 without causing damage to the main body 2 and the radiating fins 311. Therefore, the present invention provides high convenience and flexibility in use and enables easy reworking when necessary.

Further, since the main body 2 is connected to the radiating fins 311 without using any soldering material, the cost for welding can be saved.

Figure 8A:
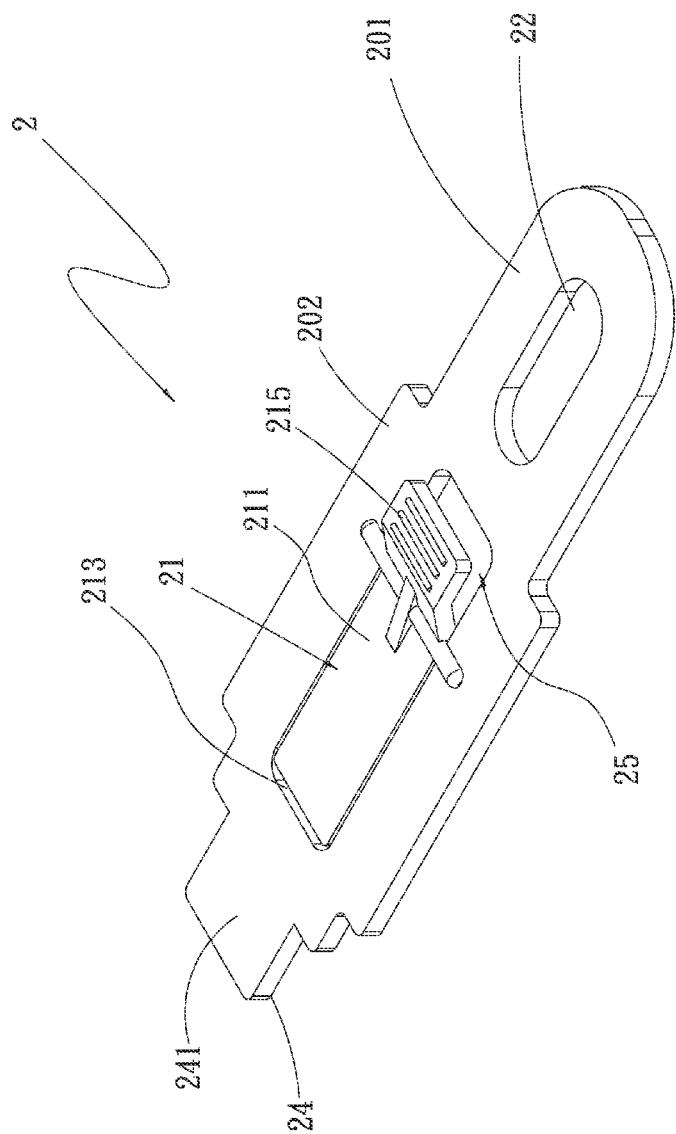
FIGS. 8A and 8B are top and bottom perspective views, respectively, of a fastening structure for thermal module according to a seventh embodiment of the present invention.
Figure 8B:
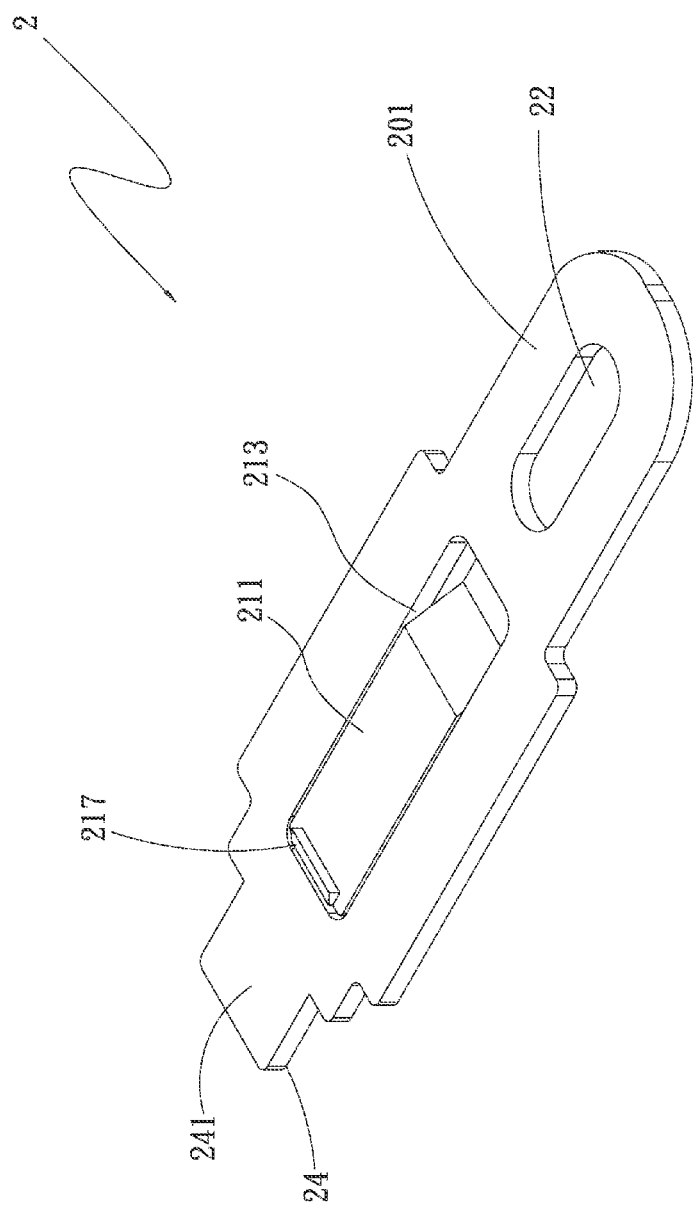

FIGS. 8A and 8B are top and bottom perspective views, respectively, of a fastening structure for thermal module according to a seventh embodiment of the present invention. As shown, the seventh embodiment is generally structurally similar to the first embodiment, except that the elastic press portion 21 includes one single elastic press arm 211, at least one opening 213, and a plurality of raised portions 215; and that the insertion unit 24 includes only a first insertion section 241. The opening 213 is formed on one side of the second body section 202 to penetrate the same in a thickness direction thereof, and communicates with the flexible space 25. The elastic press arm 211 is movably located within the opening 213. The raised portions 215 are formed on an end of the elastic press arm 211 to face toward the first body section 201.

The elastic press portion 21 in the seventh embodiment further includes at least one retainer 217, which is formed below another end of the elastic press arm 211 opposite to the raised portions 215 and is located adjacent to the insertion unit 24.

The insertion unit 24 in the seventh embodiment is generally structurally similar to that in the first embodiment, except that it omits the second insertion section 242, the space 244 and the stop sections 243 therefrom and includes only the first insertion section 241, which is outward projected from the end of the second body section 202 opposite to the first body section 101.

When the raised portions 215 on the elastic press arm 211 are pushed toward the opening 213 into the flexible space 25, another end of the elastic press arm 211 without the raised portions 215 is brought to elastically deform and move outward away from the opening 213. On the other hand, when the applied force is removed, the other end of the elastic press arm 211 will automatically spring back to an original state free of any pressure. That is, the end of the elastic press arm 211 without the raised portions 215 will move back into the opening 213. With the above arrangements, the fastening structure of the present invention can provide high convenience and flexibility in use and enable easy reworking when necessary.

Figure 9A:
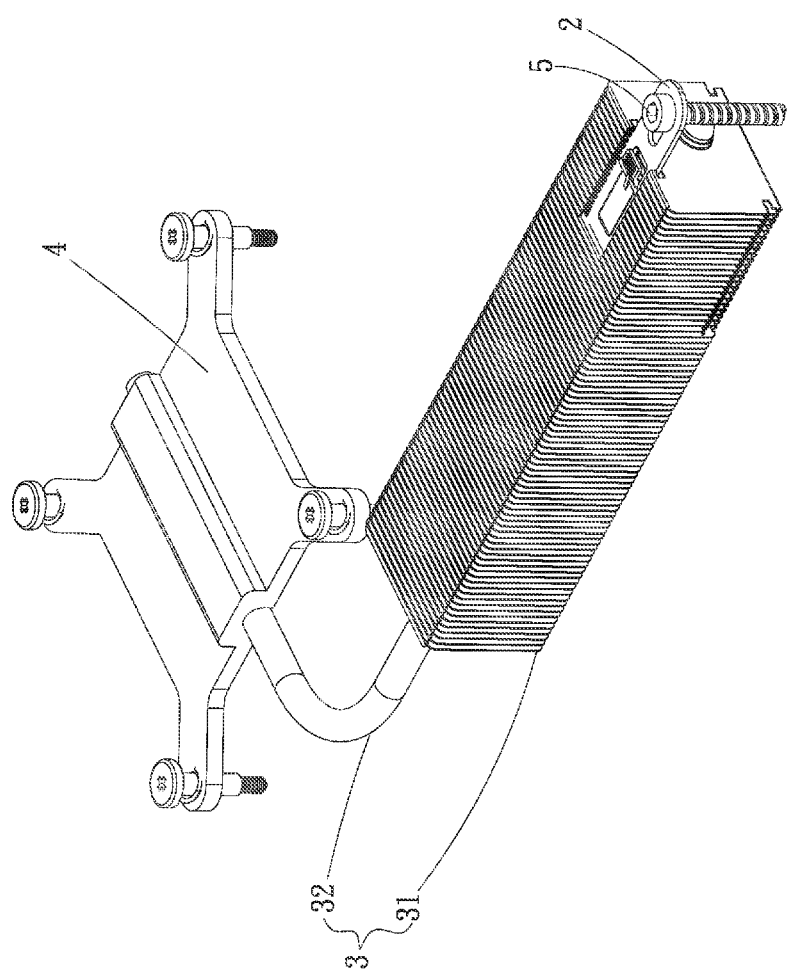
FIGS. 9A and 9B are assembled and exploded perspective views, respectively, of a fastening structure for thermal module according to an eighth embodiment of the present invention.
Figure 9B:
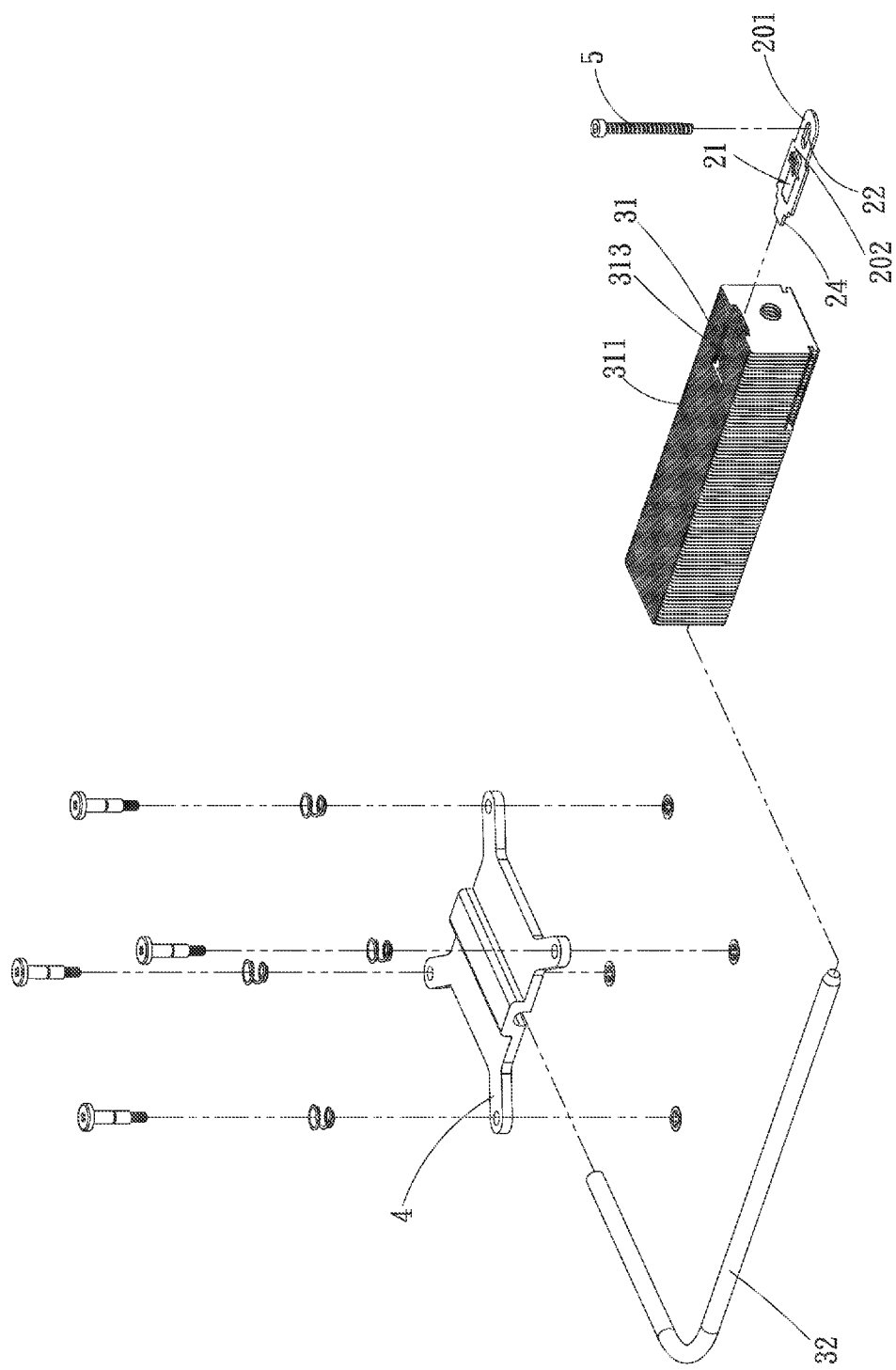

FIGS. 9A and 9B are assembled and exploded perspective views, respectively, of a fastening structure for thermal module according to an eighth embodiment of the present invention. Please refer to FIGS. 9A and 9B along with FIGS. 8A and 8B. The main body 2 in the eighth embodiment is generally structurally similar to the main body 2 in the seventh embodiment, except that it is assembled to a thermal module 3.

As shown, since the thermal module 3 in the eighth embodiment is generally structurally similar to the thermal module 3 in the second embodiment, it is not described in details herein.

In the event it is necessary to rework, simply push the raised portions 215 on the elastic press arm 211 toward the opening 213 into the flexible space 25, and the other end of the elastic press arm 211 without the raised portions 215 will elastically deform and upwardly move away from the opening 213. Meanwhile, the retainer 217 moves upward along with the elastic press arm 211 to separate from the passage defined between two adjacent radiating fins 311 in the recess 313, and the main body 2 can be quickly detached from the recess 313 on the radiating fins 311 without causing damage to the main body 2 and the radiating fins 311. Therefore, the present invention provides high convenience and flexibility in use and enables easy reworking when necessary.

Further, since the main body is connected to the heat radiating unit 31 without using any soldering material, so that the cost for welding is saved.

Figure 10A:
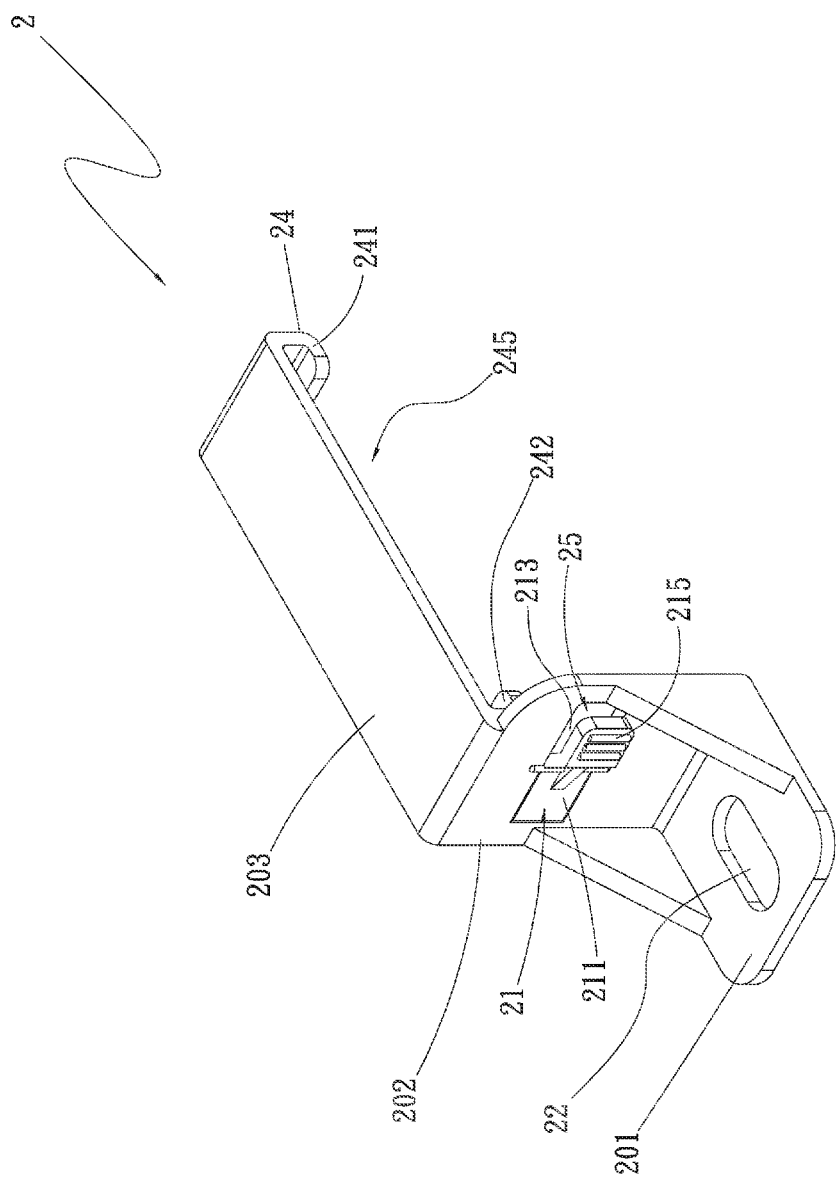
FIGS. 10A and 10B are front and rear perspective views, respectively, of a fastening structure for thermal module according to a ninth embodiment of the present invention.
Figure 10B:
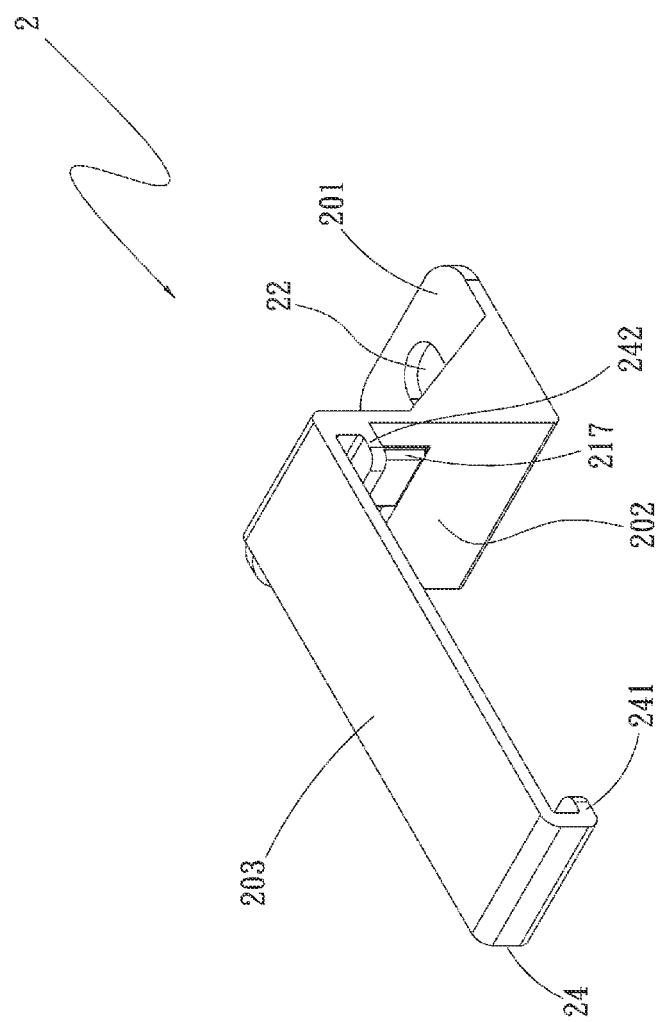

FIGS. 10A and 10B are front and rear perspective views, respectively, of a fastening structure for thermal module according to a ninth embodiment of the present invention. As shown, the ninth embodiment is generally structurally similar to the seventh embodiment, except that, in the ninth embodiment, the main body 2 further includes a third body section 203 extended between and connected at two opposite ends to the second body section 202 and the insertion unit 24, such that the third body section 203 is located at a higher position relative to the first body section 201; and that the insertion unit 24 further includes a second insertion section 242.

Figure 11A:
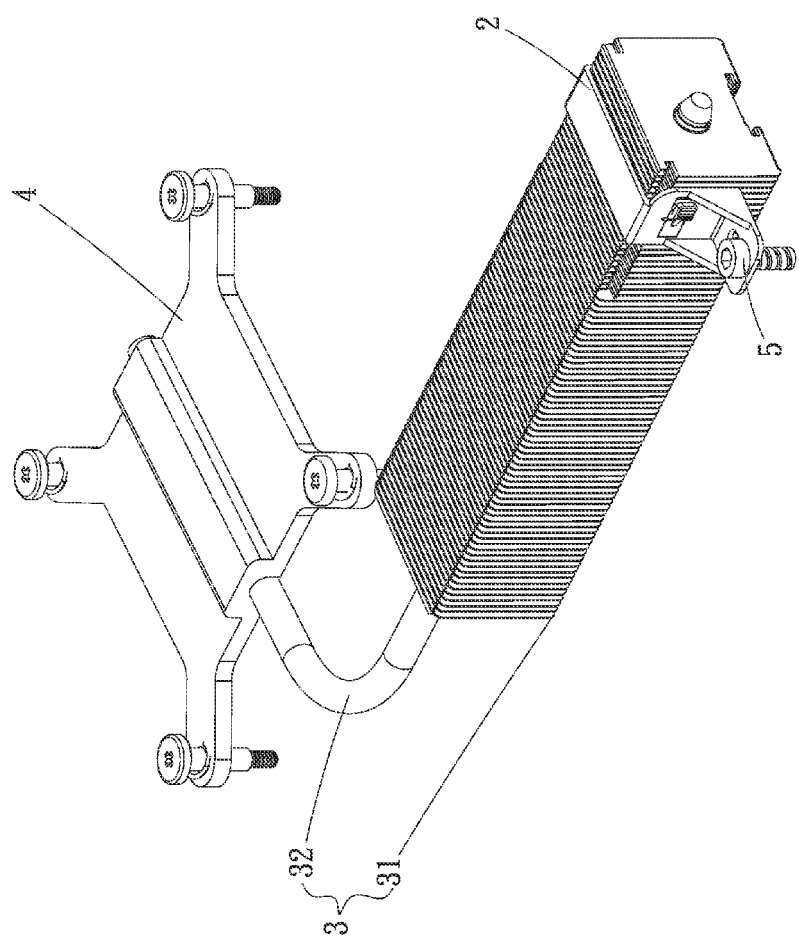

In practical implementation of the ninth embodiment, the third body section 203 may have an axially extended length and a width designed according to a height requirement of the thermal module 3 to which the main body 2 is to be assembled, as shown in FIG. 11A, so as to more firmly and stably fasten the thermal module 3 to the mainboard.

In the ninth embodiment, the insertion unit 24 further includes a second insertion section 242, which is located on another side of the second body section 202, such that the first and the second insertion section 241, 242 together define a receiving space 245 between them. In the ninth embodiment, the first insertion section 241 is substantially L-shaped but not necessarily limited thereto.

FIGS. 11A and 11B are assembled and exploded perspective views, respectively, of a fastening structure for thermal module according to a tenth embodiment of the present invention. The main body 2 in the tenth embodiment is generally structurally similar to the main body 2 in the ninth embodiment, except that it is assembled to a thermal module 3.

Further, since the thermal module 3 in the tenth embodiment is generally structurally similar to the thermal module 3 in the fourth embodiment, it is not described in details herein. In the present invention, with the first and the second insertion section 241, 242 on the main body 2 inserted into corresponding recesses 313 and the retainer 217 inwardly extending into one passage (not shown) defined between two adjacent radiating fins 311, the main body 2 can be quickly assembled to the radiating fins 311 of the thermal module 3.

In the event it is necessary to rework, simply push the raised portions 215 on the second body section 211 toward the opening 213 into the flexible space 25, and the other end of the elastic press arm 211 without the raised portions 215 will elastically deform and upwardly move away from the opening 213. Meanwhile, the retainer 217 will move upward along with the elastic press arm 211 to separate from the passage defined between two adjacent radiating fins 311 in the recess 313, and the main body 2 can be quickly slid out of the recesses 313 and detached from the radiating fins 311 without causing damage to the main body 2 and the radiating fins 311. Therefore, the present invention provides high convenience and flexibility in use and enables easy reworking when necessary.

Again, since the main body 2 of the fastening structure is connected to the heat radiating unit 31 without using any soldering material, the cost for welding is saved.

Figure 12A:
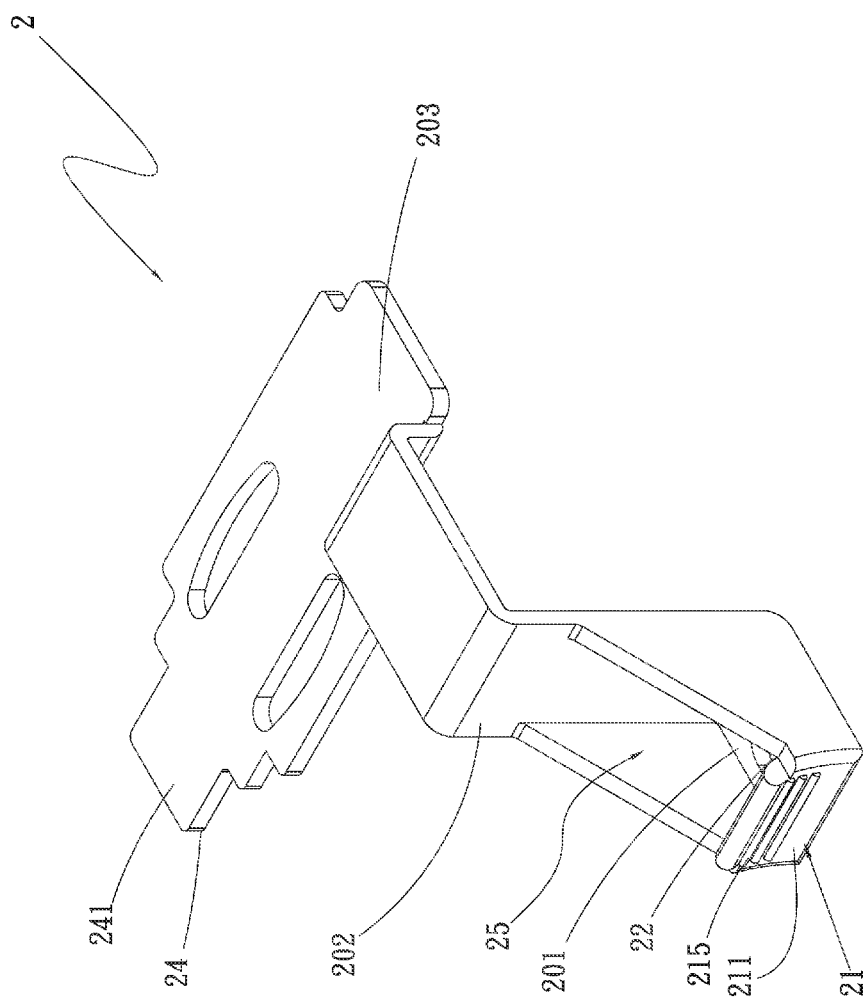
FIGS. 12A and 12B are front and rear perspective views, respectively, of a fastening structure for thermal module according to an eleventh embodiment of the present invention.
Figure 12B:
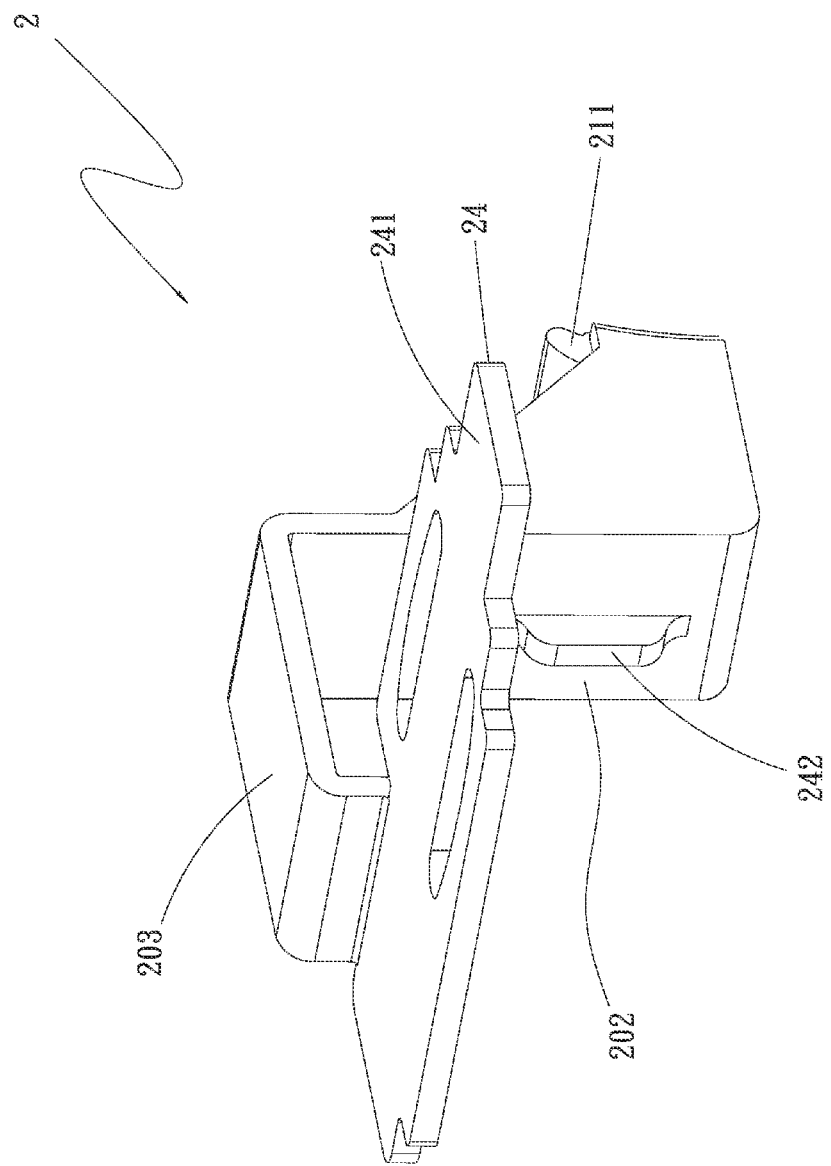

FIGS. 12A and 12B are front and rear perspective views, respectively, of a fastening structure for thermal module according to an eleventh embodiment of the present invention. As shown, in the eleventh embodiment, the fastening structure includes a main body 2, which has at least one elastic press portion 21, a fastening portion 22, an insertion unit 24, a first body section 201, a second body section 202, and a third body section 203. The fastening portion 22 is located at an end of the main body 2. More specifically, the fastening portion 22 is a hole formed on the first body section 201 and extended through the same in a thickness direction thereof for a fastening element 5, such as a screw shown in FIG. 13A, to extend therethrough and screw into a mainboard (not shown).

The second body section 202 is axially extended from another end of the first body section 201 to connect to the third body section 203, such that the third body section 203 is located at a higher position relative to the first body section 201. And, the insertion unit 24 is projected from an end of the third body section 203 farther from the second body section 202. In practical implementation of the eleventh embodiment of the present invention, the second body section 202 and the third body section 203 may respectively have an extended length and a width designed according to a height requirement of a thermal module 3, to which the main body 2 is to be assembled, so as to more firmly and stably fasten the thermal module 3 to the mainboard.

The insertion unit 24 is outward extended from another end of the main body 2, and includes a first insertion section 241 and a second insertion section 242. The first insertion section 241 is outward projected from the end of the third body section 203 farther from the second body section 202, i.e. the other end of the main body 2. The second insertion section 242 is arranged on one side of the second body section 202 facing away from the flexible space 25.

As can be seen in FIGS. 12A and 12B, the elastic press portion 21 in the eleventh embodiment is connected to an end of the main body 2, and includes an elastic press arm 211 and a plurality of raised portions 215. The elastic press arm 211 is axially extended from an end of the first body section 201, and the raised portions 215 are formed on one side of the elastic press arm 211 facing away from the flexible space 25.

The flexible space 25 is defined between the elastic press portion 21 and the main body 2 for the elastic press arm 211 to move therein. When the raised portions 215 on the elastic press arm 211 are subjected to a force in a direction toward the flexible space 25 and the second body section 202, the second insertion section 242 is caused to elastically deform and move in a direction farther away from the first insertion section 241. Meanwhile, the first and the second body section 201, 202 are also brought to elastically deform.

The second insertion section 242 and the first and the second body section 201, 202 automatically spring back to an original state free of any pressure when the force is removed from the raised portions 215 on the elastic press arm 211,. With the above arrangements, the fastening structure for thermal module according to the eleventh embodiment of the present invention also provides high convenience and flexibility in use and enables easy reworking when necessary.

Figure 13A:
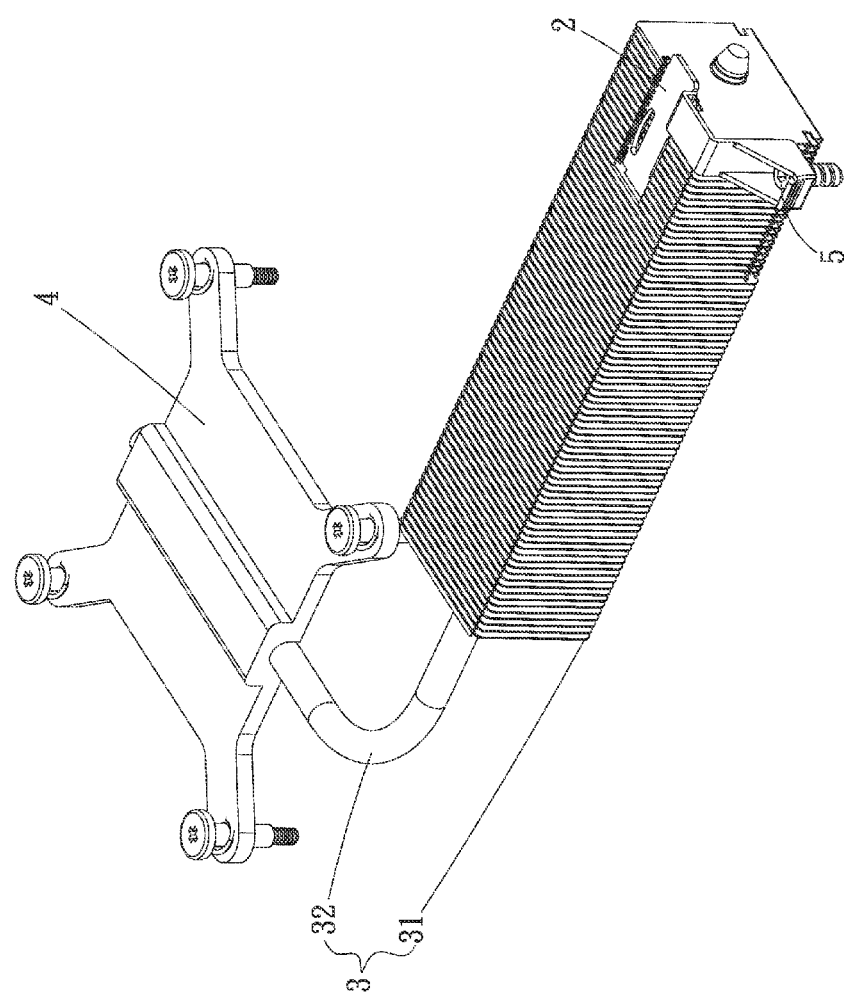
FIGS. 13A and 13B are assembled and exploded perspective views, respectively, of a fastening structure for thermal module according to a twelfth embodiment of the present invention.
Figure 13B:
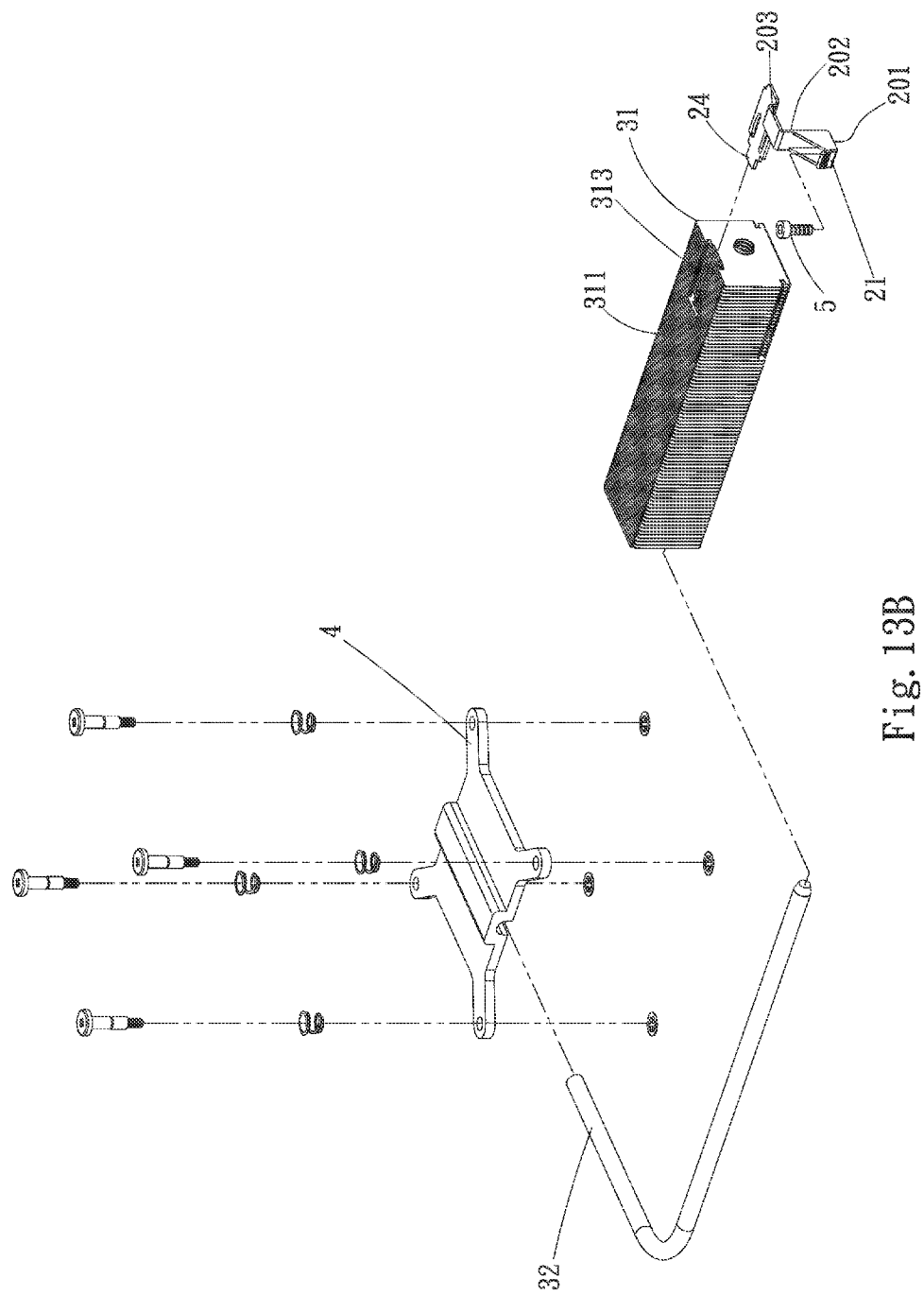

FIGS. 13A and 13B are assembled and exploded perspective views, respectively, of a fastening structure for thermal module according to a twelfth embodiment of the present invention. Please refer to FIGS. 13A and 13B along with FIGS. 12A and 12B. The main body 2 in the twelfth embodiment is generally structurally similar to the main body 2 in the eleventh embodiment, except that it is assembled to a thermal module 3.

The thermal module 3 in the twelfth embodiment is generally structurally similar to the thermal module 2 in the second embodiment, and is therefore not described in details herein. In the twelfth embodiment, the second and the third body section 202, 203 are tightly attached to two sides of the radiating fins 311, so that the radiating fins 311 can be more stably fastened to the mainboard.

In the event it is necessary to rework, simply push the raised portions 215 on the elastic press arm 211 toward the flexible space 25 and the second body section 202, and the first and the second body section 201, 202 will elastically deform and outwardly shift away from the radiating fins 311. At this point, the second insertion section 242 also moves outward along with the second body section 202 to separate from the passage defined between two adjacent radiating fins 311, and the main body 2 can be quickly detached from the recess 313 on the radiating fins 311 without causing damage to the main body 2 and the radiating fins 311. Therefore, the fastening structure for thermal module according to the twelfth embodiment of the present invention also provides high convenience and flexibility in use and enables easy reworking when necessary.

Since the main body 2 of the fastening structure is connected to the radiating fins 311 without using any soldering material, the cost for welding is saved.

In summary, the fastening structure for thermal module according to the present invention is superior to the prior art due to the following advantages: (1) allowing easy reworking; (2) providing high convenience and flexibility in use; and (3) reducing the cost for assembling the main body to the thermal module.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A fastening structure connecting a longitudinally extending thermal module to a mainboard, the thermal module comprising a plurality of transverse radiating fins arranged along a length thereof, a bottom surface disposed on the mainboard, an opposing top surface, and opposing side surfaces each comprising a recess, the fastening structure comprising:

a first body section disposed on the mainboard and comprising a fastening portion for connecting the fastening structure to the mainboard;

a second body section extending away from the mainboard, the second body section comprising:
- a lower end connected to the first body section and an upper end opposite the lower end;
- an opening between the upper and lower ends; and
- an elastic press arm connected to the second body section that is resiliently pivotable within the opening, the elastic press portion comprising:
  - a plurality of raised portions on an outer side of a first end thereof, and
  - a retainer on an inner side of a second end thereof; and a third body section connected to the upper end of the second body section and extending over the top surface of the thermal module, the third body section comprising opposing first and second insertion sections on a bottom side of the third body section, each insertion section extending laterally inward;

wherein in an unlocked position, the raised portions are pushed toward the opening, thereby resiliently pivoting the second end of the elastic press arm to move the retainer out of the opening, such that first and second insertion structures can engage within the recesses in the side surfaces of the thermal module, and wherein in a locked position, the elastic press arm is released within the opening such that the retainer is positioned within the opening and engages with a passage defined between two adjacent radiating fins, thereby longitudinally locking the fastening structure with the thermal module.

2. The fastening structure as claimed in claim 1, wherein the fastening portion is a hole, via which a fastening element is extended to screw into a mainboard.

3. The fastening structure as claimed in claim 1, wherein the thermal module, includes a heat radiating unit and a heat transfer unit, and the heat transfer unit having an end extended through the heat radiating unit and another opposite end attached to a base.

4. The fastening structure as claimed in claim 3, wherein the heat radiating unit is a radiating fin assembly or a heat sink, and the heat transfer unit is a heat pipe.

5. The fastening structure as claimed in claim 3, wherein the heat transfer unit is a heat pipe having an end attached to one side of the base and another opposite end extended through the radiating fins.

* * * * *